(12) United States Patent
Ishikawa et al.

(10) Patent No.: US 7,110,295 B2
(45) Date of Patent: Sep. 19, 2006

(54) SEMICONDUCTOR DATA PROCESSING DEVICE

(75) Inventors: Jiro Ishikawa, Higashimurayama (JP); Takashi Yamaki, Kodaira (JP); Toshihiro Tanaka, Akiruno (JP); Yukiko Umemoto, Kodaira (JP); Akira Kato, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/002,802

(22) Filed: Dec. 3, 2004

(65) Prior Publication Data

US 2005/0128815 A1 Jun. 16, 2005

(30) Foreign Application Priority Data

Dec. 9, 2003 (JP) ............... 2003-410391

(51) Int. Cl.
*G11C 16/04* (2006.01)
(52) U.S. Cl. .............. 365/185.11; 365/185.13; 365/185.29; 365/185.33
(58) Field of Classification Search .......... 365/185.11, 365/185.13, 185.29, 185.33
See application file for complete search history.

(56) References Cited

U.S. PATENT DOCUMENTS

| 5,297,096 | A | | 3/1994 | Terada et al. ............. 365/218 |
| 5,963,479 | A | | 10/1999 | Park et al. ............. 365/185.29 |
| 6,002,152 | A | * | 12/1999 | Guterman et al. .......... 257/316 |
| 6,043,530 | A | * | 3/2000 | Chang ..................... 257/320 |
| 6,288,941 | B1 | | 9/2001 | Seki et al. ............. 365/185.12 |
| 6,493,262 | B1 | * | 12/2002 | Wald et al. ............ 365/185.15 |
| 6,563,733 | B1 | * | 5/2003 | Liu et al. ................ 365/185.1 |
| 6,849,502 | B1 | * | 2/2005 | Sasago et al. ............. 438/257 |
| 6,868,008 | B1 | * | 3/2005 | Kamei et al. .......... 365/185.09 |

FOREIGN PATENT DOCUMENTS

| JP | 2-232899 | 9/1990 |
| JP | 3-105795 | 5/1991 |
| JP | 4-228193 | 8/1992 |
| JP | 6-103790 | 4/1994 |
| JP | 6-150677 | 5/1994 |
| JP | 10-199271 | 7/1998 |

* cited by examiner

*Primary Examiner*—Hoai V. Ho
(74) *Attorney, Agent, or Firm*—Miles & Stockbridge PC

(57) ABSTRACT

An erasing current is distributed to reduce a load of an internal power circuit and to decrease the number of drivers for erase. A semiconductor data processing device has: a memory array having nonvolatile memory cells arrayed in a matrix and divided into a plurality of erase blocks each instructed to be erased together; and a control circuit, wherein the control circuit controls both of two kinds of erasing voltages applied to the nonvolatile memory cell in the erase block instructed to be erased together to select an erase sector from the erase block for performing erase for each erase sector, thereby performing the erase for each erase sector in time division. Time division erase can distribute an erasing current. Two kinds of erasing voltages are used to select the erase sector. No specific drivers need be provided for each erase sector.

18 Claims, 25 Drawing Sheets

SEMICONDUCTOR DATA PROCESSING DEVICE

CROSS-REFERENCE TO RELATED APPLICATION

The present application claims priority from Japanese patent application No. 2003-410391 filed on Dec. 9, 2003, the content of which is hereby incorporated by reference into this application.

BACKGROUND OF THE INVENTION

The present invention relates to a semiconductor data processing device having electrically erasable and writable nonvolatile memory cells, more specifically, to a technique for erasing the nonvolatile memory cells. For instance, the present invention relates to a technique effective to be applied to a flash memory or a microcomputer over which the same is mounted.

Patent Reference 1 describes a technique in which a flash memory array is divided into sectors to sequentially perform erase for each of the sectors, and before completely erasing the memory cells in one sector, erase of the memory cells in another sector is started to shift erase of the sectors in time for distributing a peak current at erase.

Patent Reference 2 describes a technique in which a flash memory array is divided into blocks to sequentially perform application of an erasing voltage for each of the blocks, thereby distributing a peak current at erase.

Patent Reference 3 describes a technique in which a chip has a plurality of memory arrays, erase is performed plural times for time division erase, thereby distributing a peak current at erase. The memory arrays are erased together. The memory arrays are divided into groups which are erased together. The number of memory arrays in the group is increased corresponding to the progress of erase to shorten erase time.

Patent Reference 4 describes a technique in which a memory array is divided into blocks to perform time division erase for each of the blocks, thereby distributing a peak current at erase. At erase, erase verify is performed for each of the blocks, thereby preventing over erase.

Patent Reference 5 describes a technique in which a memory array is divided to perform time division erase for each division, thereby distributing a peak current at erase for preventing the erasing voltage level from being lowered and for reducing the load of an internal booster circuit.

Patent Reference 6 describes a technique in which a memory array is divided into blocks, part or all of the memory array has a plurality of subdivided blocks to perform erase for each of the subdivided blocks, thereby distributing a peak current at erase.

[Patent Reference 1] Japanese Unexamined Patent Publication No. Hei 10 (1998)-199271
[Patent Reference 2] Japanese Unexamined Patent Publication No. Hei 6 (1994)-150677
[Patent Reference 3] Japanese Unexamined Patent Publication No. Hei 6 (1994)-103790
[Patent Reference 4] Japanese Unexamined Patent Publication No. Hei 4 (1992)-228193
[Patent Reference 5] Japanese Unexamined Patent Publication No. Hei 2 (1990)-232899
[Patent Reference 6] Japanese Unexamined Patent Publication No. Hei 3 (1991)-105795

SUMMARY OF THE INVENTION

According to Patent References 1 to 5, a memory array is divided into erase blocks to erase together all memory cells in the erase block. The maximum current consumption flowed at erase is the multiplier of an erasing current of one memory cell and the number of memory cells in the block. When the number of memory cells in one erase block is large, the maximum current consumption at erase is increased. The area of a power circuit part supplying a voltage and an electric current necessary for erase must be sufficiently secured. According to Patent Reference 6, a memory array is divided into erase blocks to subdivide the erase block for performing time division erase, thereby distributing the maximum current consumption at erase. In this technique, there is one kind of erasing power source. One of two kinds of erasing voltages applied to a nonvolatile memory cell requires an erasing driver for each subdivision.

An object of the present invention is to provide a semiconductor data processing device which can distribute an erasing current to reduce the load of an internal power circuit and can decrease the number of drivers for erase to make the chip area occupied by decoders and drivers smaller.

The above and other objects and novel features of the present invention will be apparent from the description of this specification and the attached drawings.

The representative aspects of the invention disclosed in this application will be briefly described as follows.

[1] A semiconductor data processing device according to the present invention has a memory array having nonvolatile memory cells arrayed in a matrix and divided into a plurality of erase blocks each instructed to be erased together; and a control circuit, wherein the control circuit controls both of two kinds of erasing voltages applied to the nonvolatile memory cell in the erase block instructed to be erased together to select an erase sector from the erase block for performing erase for each erase sector, thereby performing the erase for each erase sector in time division.

The erase for each erase sector is performed in time division. An erasing current is distributed to reduce the load of an internal power circuit. The power circuit is made smaller to reduce a chip area. Further, in order to select the erase sector in time division for performing erase, both of two kinds of erasing voltages applied to the nonvolatile memory cell are controlled. No specific erasing drivers need be provided for each erase sector. The chip area occupied by the erasing drivers can be reduced. Specifically, two kinds of erasing voltage driving drivers applying two kinds of erasing voltages to the nonvolatile memory cell shareably drive a plurality of sectors, respectively.

[2] As a specific form of the present invention, the nonvolatile memory has a source, a drain, a channel, a control gate arranged over the channel on the source side and a charge storage region and a memory gate stacked over the channel on the drain side to be electrically insulated from each other, and a dielectric breakdown seen from the control gate is lower than that seen from the memory gate.

As described above, when a MOS transistor part for selection having the control gate of the nonvolatile memory cell is brought to the ON state in data read operation, stored information is read on a bit line according to whether an electric current is flowed or not corresponding to the threshold voltage state of a MONOS transistor part for holding memory having the memory gate of the nonvolatile memory cell. The breakdown voltage seen from the control gate is lower than that seen from the memory gate (the gate oxide film is thin). As compared with the case that both the MONOS transistor part for holding memory and the MOS transistor part for selection are formed of high voltage, the amount of read signal current in read operation of the nonvolatile memory cell, that is, GM (mutual conductance) can be relatively increased, contributing to increase of the read speed.

In operation for setting a relatively high threshold voltage to the MONOS transistor part for holding memory, for instance, a high voltage is applied to the memory gate, the MOS transistor part for selection is ON operated for flowing an electric current from a source line to a bit line, and hot electrons produced near the charge storage region on the control gate side may be held in the charge storage region. In operation for setting a relatively low threshold voltage to the MONOS transistor part for holding memory, for instance, a high voltage may be applied to the memory gate to release electrons held in the charge storage region to the memory gate, or holes may be injected from the channel to the charge storage region. The operation for setting a relatively low threshold voltage or a relatively high threshold voltage to the MONOS transistor part for holding memory can be realized without applying a high voltage to the control gate and the drain. This ensures that the gate breakdown voltage of the MOS transistor part for selection may be relatively low.

To ensure the low gate breakdown voltage of the MOS transistor part for selection in device structure, for instance, an impurity diffusion region or a high concentration impurity region is not formed between the drain and the source formed in the well region. In the case that the serial connection node of the MONOS transistor part for holding memory and the MOS transistor part for selection is a diffusion region (source and drain regions) shared between both, when a high voltage is applied to the MONOS transistor part at write to form a channel, the high voltage applied to the MONOS transistor part side is applied from the channel via the diffusion region shared between the both transistor parts to the MOS transistor part for selection. In this case, the MoS transistor part for selection must be formed of high voltage.

As the charge storage region, a conductive floating gate electrode covered by an insulator film, an electric charge trap insulator film covered by an insulator film, or a conductive particle layer covered by an insulator film may be used.

[3] As a specific form of the present invention, a switch MOS transistor which can selectively connect a bit line connected to the drain to a global bit line may be provided to employ a divided bit line structure (hierarchical bit line structure). In the divided bit line structure, in read operation, only some nonvolatile memory cells are connected to the global bit line to reduce parasitic capacitance of the bit line in appearance, thereby making read operation faster. At this time, a high voltage need not be applied to the bit line in erase and write operation. The gate breakdown voltage of the switch MOS transistor may be lower than that seen from the memory gate of the nonvolatile memory cell. In other words, it is easy to provide relatively large GM to the switch MOS transistor. Making read operation by the divided bit line structure faster can be ensured.

[4] As a more specific form, a semiconductor data processing device has a first driver driving a control gate control line connected to the control gate, a second driver driving a memory gate control line connected to the memory gate, a third driver driving the switch MOS transistor to an ON state, and a fourth driver driving a source line connected to the source, wherein the second and fourth drivers are the two kinds of erasing voltage driving drivers at erase, and wherein the first and third drivers use a first voltage as an operating power source and the second and fourth drivers use a voltage higher than the first voltage as an operating power source.

Further, the control circuit, when increasing a threshold voltage of the nonvolatile memory cell seen from the memory gate by write, uses the operating power source of the first driver as the first voltage, the operating power source of the fourth driver as a second voltage higher than the first voltage, and the operating power source of the second driver as a third voltage higher than the second voltage, thereby injecting hot electrons from a bit line electrode side to the charge storage region.

Further, the control circuit, when decreasing the threshold voltage of the nonvolatile memory cell seen from the memory gate by erase, uses the operating power source of the second driver as a fourth voltage lower than the third voltage, and the operating power source of the fourth driver as a fifth voltage higher than the second voltage, thereby injecting holes to the charge storage region to make electrons disappear.

The control circuit, when reading stored information from the nonvolatile memory cell, uses the operating power source of the first driver as the first voltage. The direction of an electric current in read operation may be either from the bit line to the source line or is reverse.

[5] From the viewpoint of layout, the first and third drivers may input an address decode signal to select operation, and the second and fourth drivers may input an output of the first driver to select operation. The first and third drivers may be arranged on one side across the array of the nonvolatile memory cells, and the second and fourth drivers may be arranged on another side. It is possible to isolate the drivers using a high voltage as an operating power source from the circuits operated using a relatively low voltage as an operating power source.

[6] The above-described semiconductor data processing device has a single nonvolatile memory mounted thereover. It may be a semiconductor data processing device such as a microcomputer or data processor having an on-chip nonvolatile memory. For instance, the semiconductor data processing device further has a logic operating unit performing logic operation using the first voltage as an operating power source.

The effect obtained by the representative aspects of the invention disclosed in this application will be briefly described as follows.

An erasing current is distributed to reduce the load of an internal power circuit. The number of drivers for erase can be decreased to make the chip area occupied by the decoders and drivers smaller.

DETAILED DESCRIPTION OF THE INVENTION

Figure 1:
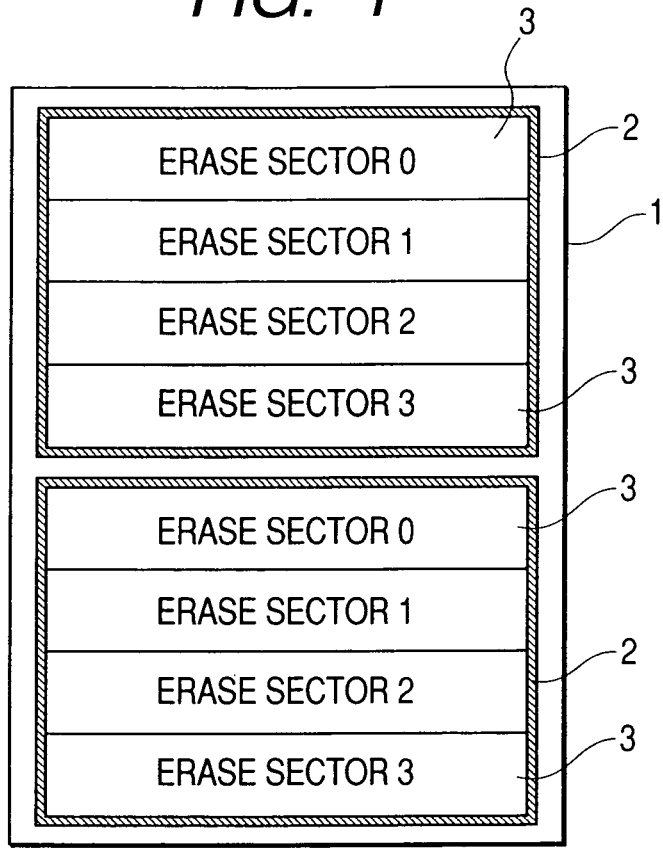
FIG. 1 is an explanatory view schematically showing the divided structure of erase blocks in a flash memory to which the present invention is applied.

FIG. 1 schematically shows the divided structure of erase blocks in a flash memory to which the present invention is applied. A memory array 1 is divided into a plurality of erase blocks 2. The erase block 2 is subdivided into a plurality of erase sectors 3. Erase is performed by specifying the target erase block 2 by an erase command. Erase in the erase block 2 is performed for each of the erase sectors 3. In this method, each of the erase sectors 3 is dividedly erased without erasing the entire erase block together. As compared with the case of erasing the entire erase block together, an electric current necessary for erase can be distributed. Distribution of the erasing current leads to reduction of the area of a power circuit producing erasing voltage.

In the erase method, erase instruction is performed for each of the erase blocks 2. The erase block 2 is divided into a plurality of the erase sectors 3 to implicitly erase each of the erase sectors 3. The number of memory cells erased together is decreased to reduce the maximum current consumption at erase. Two or more erase blocks 2 and erase sectors 3 can employ the erase method.

Figure 2A:
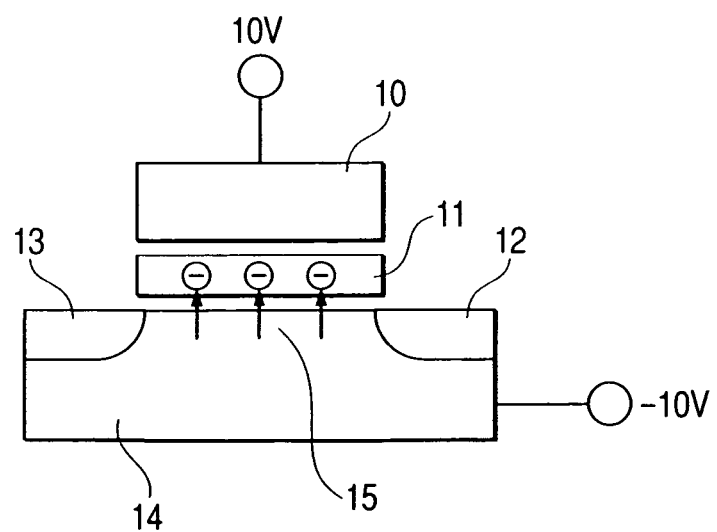
FIG. 2A is an explanatory view showing a write method to a stacked gate flash memory cell.
Figure 2B:
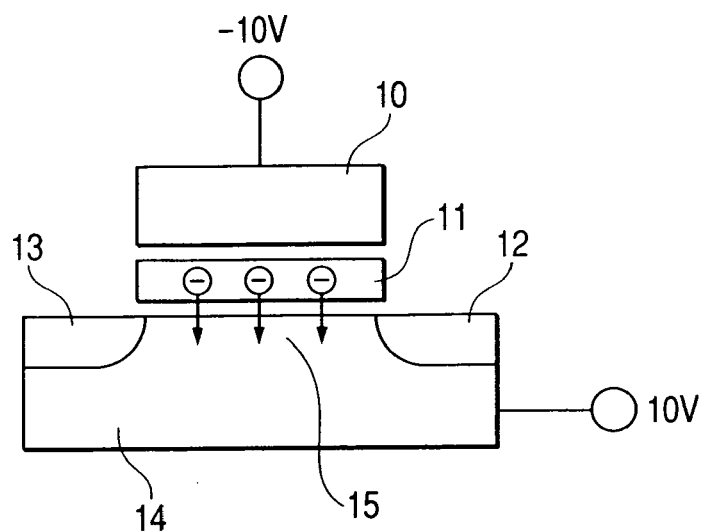
FIG. 2B is an explanatory view showing an erase method for drawing out electrons in a charge storage layer to a substrate to the stacked gate flash memory cell.
Figure 2C:
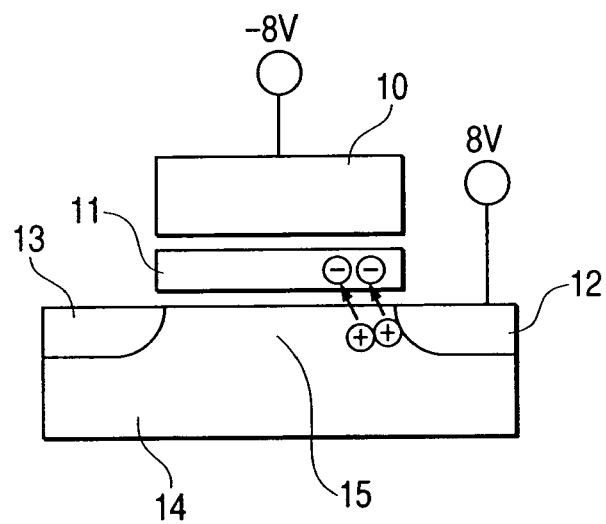
FIG. 2C is an explanatory view showing an erase method for injecting holes from the source end to the charge storage layer to the stacked gate flash memory cell.
Figure 2D:
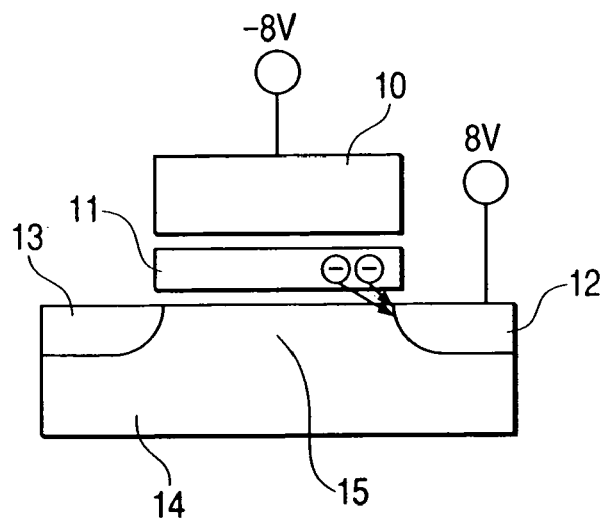
FIG. 2D is an explanatory view showing an erase method for drawing out electrons in the charge storage layer to the source end to the stacked gate flash memory cell.

FIGS. 2A to 2D show a nonvolatile memory cell (stacked gate flash memory cell) of a stacked gate structure constructing a flash memory (flash EEPROM). In the stacked gate flash memory cell, a source 12 and a drain 13 are formed over a semiconductor substrate 14, and a charge storage layer (charge storage region) 11 and a control gate 10 are formed over a channel 15 to be insulated from each other. The stacked gate flash memory cell shown in the drawing is applied to a flash memory in which erase is performed for each block using two kinds of power sources. FIG. 2A shows a write method in which 10V is applied to the control gate 10 and −10V is applied to the substrate 14, and electrons are injected into the charge storage layer 11. FIG. 2B shows an erase method in which −10V is applied to the control gate 10 and 10V is applied to the substrate 14, and electrons in the charge storage layer 11 are drawn out to the substrate. FIG. 2C shows an erase method in which −8V is applied to the control gate 10, 8V is applied to the source 12, holes are injected from the source end into the charge storage layer 11 to make electrons in the charge storage layer 11 disappear. FIG. 2D shows an erase method in which −8V is applied to the control gate 10, 8V is applied to the source 12, and electrons in the charge storage layer 11 are drawn out to the source end.

Figure 3A:
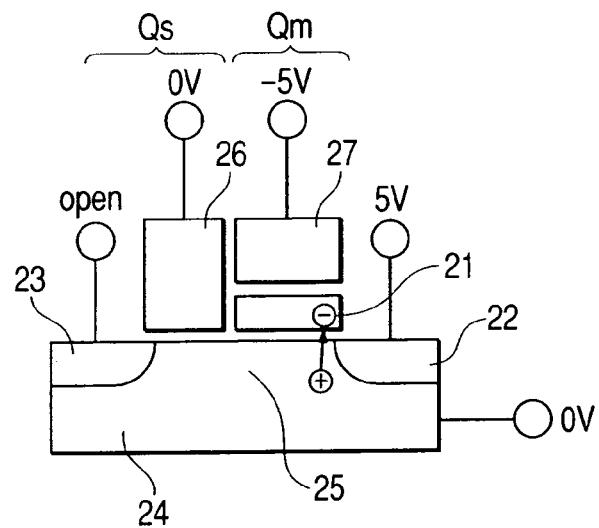
FIG. 3A is an explanatory view showing an erase method for implanting a hole to a charge storage layer to a split gate flash memory cell.
Figure 3B:
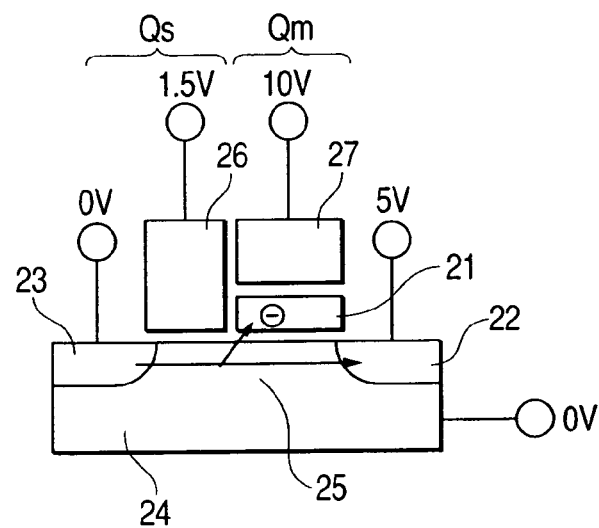
FIG. 3B is an explanatory view showing a write method by source side injection to the split gate flash memory cell.
Figure 3C:
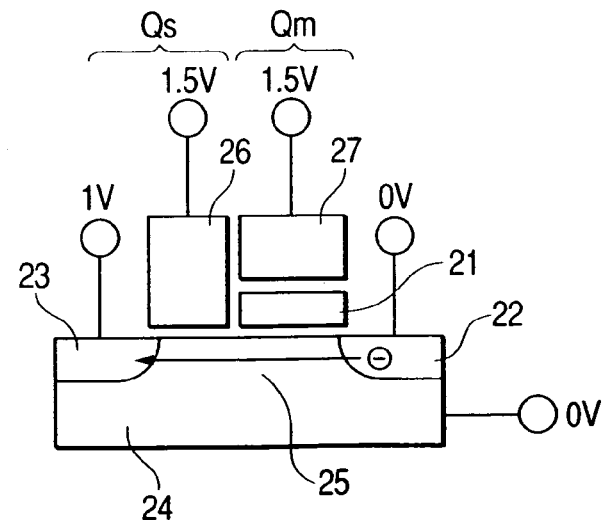
FIG. 3C is an explanatory view showing the read operation in the split gate flash memory cell.

FIGS. 3A to 3C show a nonvolatile memory cell (split gate flash memory cell) of a split gate structure constructing a flash memory (flash EEPROM). The split gate flash memory cell has a source 22, a drain 23 and a channel 25 formed over a semiconductor substrate 24. A control gate 26 is arranged over the channel 25 on the drain 23 side. A charge storage region 21 and a memory gate 27 are stacked over the channel 25 on the source 22 side to be electrically insulated from each other. As the charge storage region 21, a conductive floating gate electrode covered by an insulator film, e.g., a polycrystalline silicon electrode, an electric charge trap insulator film covered by an insulator film, e.g., a silicon nitride film, or a conductive particle (polycrystalline silicon particle) layer covered by an insulator film may be used.

The thus-constructed split gate flash memory cell has a serial connection structure of a MOS transistor part for selection (selection transistor part) Qs having the control gate and a MONOS (metal oxide nitride oxide semiconductor) transistor part (memory transistor part) Qm for holding memory having the memory gate and the charge storage region. The dielectric breakdown seen from the control gate is lower than that seen from the memory gate. In other words, thickness ts of the gate insulator film of the selection transistor part Qs is smaller than thickness tm of the gate insulator film of the memory transistor part Qm (ts<tm).

FIG. 3A shows an erase method in which an applied voltage of −5V is applied to the memory gate 27, 0V is applied to the substrate 24, 5V is applied to the source 22, and a hole is injected into the charge storage layer 21. The hole is coupled to a stored electron to disappear. A memory cell current at read is increased. FIG. 3B shows a write method in which 10V is applied to the memory gate 27, 5V is applied to the source 22, 0V is applied to the drain 23, and 0V is applied to the substrate 24. At this time, an electron is stored in the charge storage layer 21 by source side injection. Operation for setting a relatively low threshold voltage or a relatively high threshold voltage to the memory transistor part Qm can be realized without applying a high voltage to the control gate and the drain. This ensures that the gate breakdown voltage of the transistor part Qs for selection may be relatively low.

To ensure the low gate breakdown voltage of the transistor part Qs for selection in device structure, for instance, an impurity diffusion region or a high concentration impurity region is not formed between the drain and the source formed in the well region. In the case that the serial connection node of the MONOS transistor part for holding memory and the MOS transistor part for selection is a diffusion region (source and drain regions) shared between both, when a high voltage is applied to the MONOS transistor part at write to form a channel, the high voltage applied to the MONOS transistor part side is applied from the channel via the diffusion region shared between the both transistor parts to the MOS transistor part for selection. In this case, the MOS transistor part for selection must be formed of high voltage.

When reading data of the memory cell, as shown in FIG. 3C, 1.5V is applied to the memory gate 27, 1.5V is applied to the control gate 26, 0V is applied to the source 22, 1V is applied to the drain 23, 0V is applied to the substrate 24, and a sense amp judges the magnitude of a memory cell current. In other words, when the transistor part Qs for selection having the control gate of the on volatile memory cell is brought to the ON state in data read operation, stored information is read on a bit line according to whether an electric current is flowed or not corresponding to the threshold voltage state of the memory transistor part Qm having the memory gate 27 of the nonvolatile memory cell. The breakdown voltage seen from the control gate 26 is lower than that seen from the memory gate 27 (the gate oxide film is thin) As compared with the case that both the memory transistor part Qm and the transistor part Qs for selection are formed by a high voltage, the amount of read signal current in read operation of the nonvolatile memory cell, that is, Gm (mutual conductance) can be relatively increased, contributing to increase of the read speed.

Figure 4:
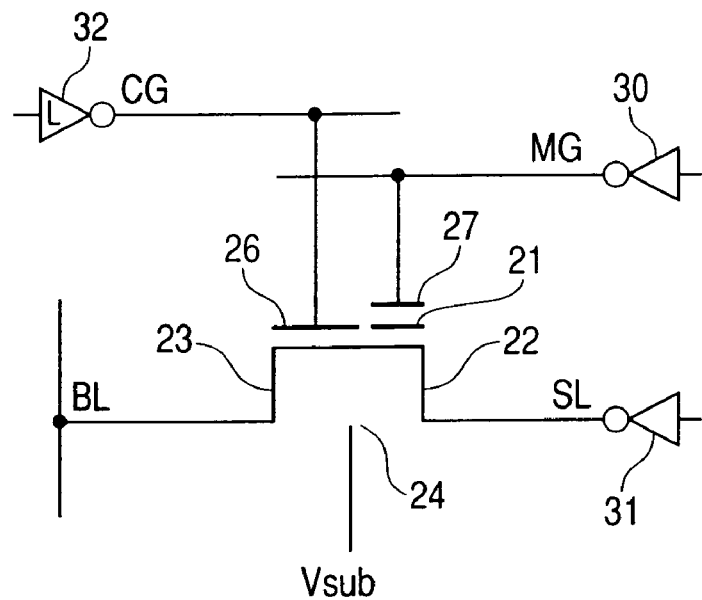
FIG. 4 is a circuit diagram showing the overview of drivers of the control gate, memory gate and source of a memory cell.

FIG. 4 shows the overview of drivers of the control gate, the memory gate and the source of a memory cell. The memory gate 27 is connected to a memory gate line MG, the source 22 is connected to a source line SL, the drain 23 is connected to a bit line BL, the control gate 26 is connected to a control gate line CG, and the substrate 24 is connected to a substrate potential Vsub. In this memory cell, the same power terminal is used to change applied voltages for performing the write, erase and read operations. A high voltage of 5V or above is applied to the memory gate 27 and the source 22 at write or erase. The memory gate line MG and the source line SL are connected to high voltage MOS drivers 30 and 31. 1.5V is applied to the control gate 26 at read and write, and 0V is applied thereto at erase. The control gate line CG is connected to a MOS driver 32 formed of a gate dielectric breakdown lower than that of the high breakdown voltage MOS driver. The high voltage MOS drivers 30 and 31 for the memory gate and the source are constructed by transistors in which the gate insulator film thickness is larger than the MOS driver 32 for the control gate. The current supply ability is low and the size of the MOS transistors is increased.

Figure 5:
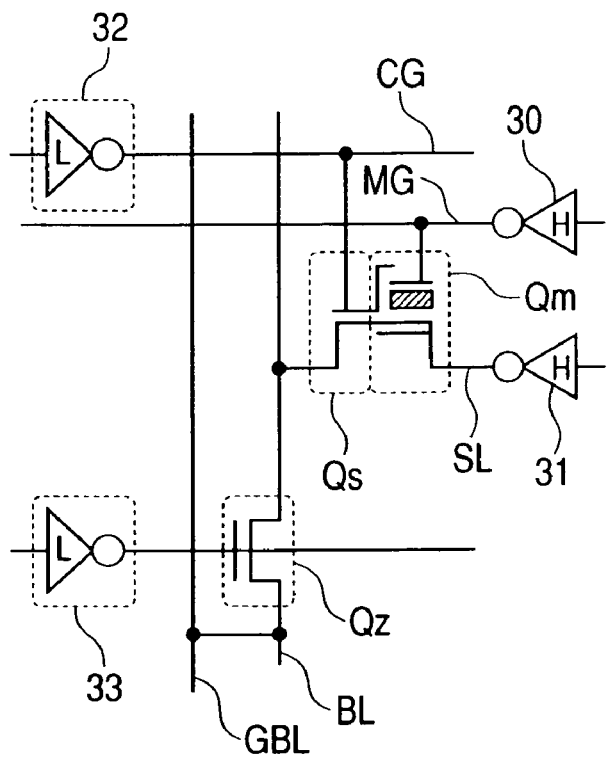
FIG. 5 is a circuit diagram showing a split gate flash memory cell in a bit line hierarchical structure.

FIG. 5 shows a split gate flash memory cell in a bit line hierarchical structure. The bit line BL is connected via a hierarchical switch MOS transistor (ZMOS) Qz to a global bit line GBL. The bit line hierarchical structure is provided for each erase block.

FIG. 5 representatively shows the driver (word driver) 32 driving the control gate control line CG, the driver (memory gate driver) 30 driving the memory gate control line MG, a driver (Z driver) 33 switch driving the hierarchical switch MOS transistor Qz, and the driver (source driver) 31 driving the source line SL. The drivers 30 and 31 are constructed by high voltage MOS drivers using MOS transistors whose gate dielectric breakdown is high. The drivers 32 and 33 are constructed by drivers using MOS transistors whose gate dielectric breakdown is relatively low.

In write operation for setting a relatively high threshold voltage to the memory transistor part Qm of the flash memory cell, as described above, hot electrons produced near the charge storage region 21 on the control gate 26 side may be held in the charge storage region 21. In write operation, for an n-channel flash memory cell, the functions of the source 12 and the drain 13 are reversed. The write form is source side injection of hot electrons.

As described above, in the write and erase to the memory transistor part Qm, a high voltage need not be applied to the control gate control line CG and the bit line BL. This ensures that the gate breakdown voltage of the selection transistor part Qs may be relatively low. The hierarchical MOS transistor Qz need not be formed of high voltage. The memory array 1 not employing the bit line hierarchical structure will be described below.

Figure 6:
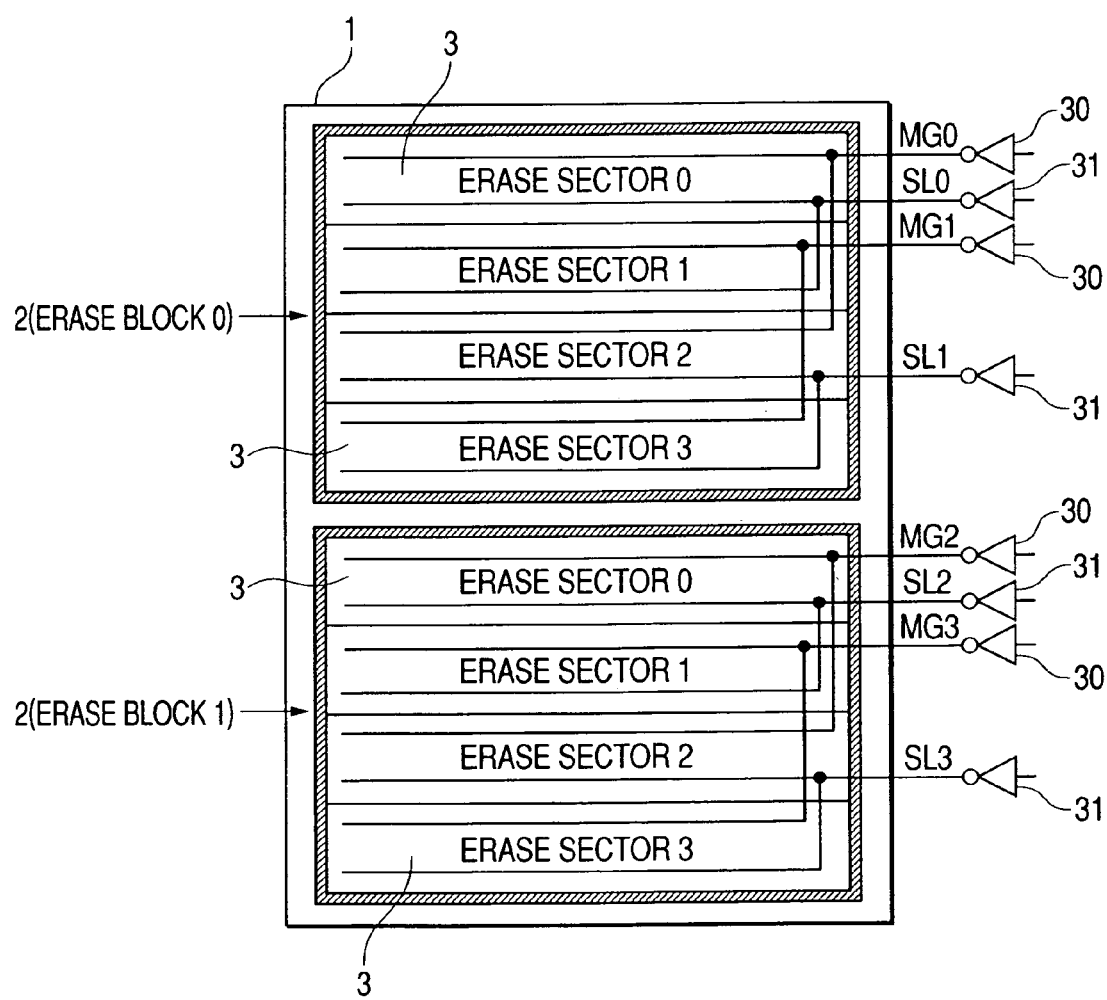
FIG. 6 is an explanatory view showing the structure of the erase sectors in the memory array using split gate flash memory cells.

FIG. 6 shows the structure of the erase sectors in the memory array 1 using the split gate flash memory cells. The memory cells are erased by applying erasing voltages to two kinds of lines of the memory gate line MG and the source line SL at the same time. The memory array 1 is divided into two erase blocks 2. Each of the erase blocks has four erase sectors 3. To the erase sectors 3 in one erase block, the source lines SL0 to SL3 are shareably connected to the adjacent two erase sectors. The memory gate lines MG0 to MG3 are shareably connected to odd-numbered or even-numbered two erase sectors. In erase operation, the high voltage MOS drivers 30 and 31 as the erasing voltage driving drivers shareably drive two corresponding sectors, respectively. Depending on a combination of the memory gate line MG and the source line SL driven, one erase sector is selected to be erased. For instance, when erasing erase sector 0 in erase block 0, voltages are applied to the memory gate line MG0 and the source line SL0 at the same time. Likewise, when erasing erase sector 1, voltages are applied to the memory gate line MG1 and the source line SL0 at the same time. When erasing erase sector 2, voltages are applied to the memory gate line MG0 and the source line SL1 at the same time. When erasing erase sector 3, voltages are applied to the memory gate line MG1 and the source line SL1 at the same time. When erasing erase sector 0 in erase block 1, as in the erase block 0, voltages are applied to the memory gate line MG and the source line SL in the target erase sector at the same time.

Figure 28:
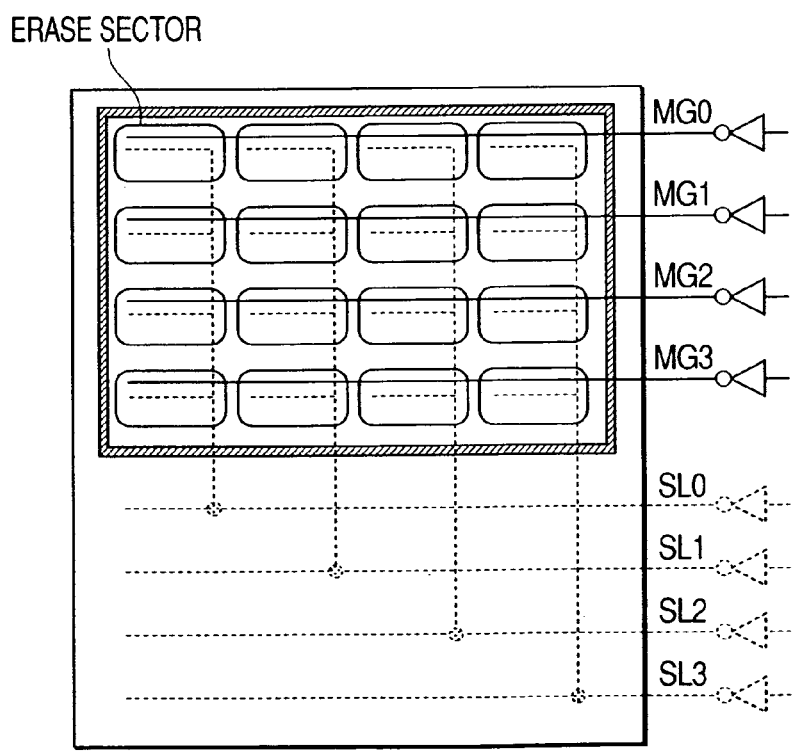
FIG. 28 is an explanatory view showing another structure of the erase sectors in the memory array using split gate flash memory cells.

In the structure in which depending on a combination of the memory gate line MG and the source line SL driven, one erase sector is selected to be erased, the erase sectors can be divided in the erase block in both row and column and the memory gate line MG and the source line SL can be of a hierarchical structure. As shown in FIG. 5, the structure of the memory gate line MG and the source line SL divides both the memory gate line MG and the source line SL in the erase block. In addition to this example, the memory gate line MG is divided and the source line SL is shared, or the memory gate line MG is shared and the source line SL is divided. In the case of a large erasing current, the erase sector is made smaller to reduce the number of the memory cells erased at the same time. For instance, it can be realized by dividing the source line St of FIG. 5 in the column direction. As shown in FIG. 28, the source line SL may be divided in the row direction. In this case, one erase sector is provided for each byte or word. Write and erase are enabled for each byte or word.

The nonvolatile memory cell is not limited to the split gate type or the stacked gate type. A nonvolatile memory cell to which two kinds of erasing voltages are applied in parallel at erase can constitute the erase sectors in the erase block, as described above.

As shown in FIG. 6, the drivers connected to the erase sectors are shared. As compared with the case that each erase sector constructs the drivers of the memory gate line and the source line, the number of the selecting decoders and drivers for erasing power source application can be decreased.

Figure 7:
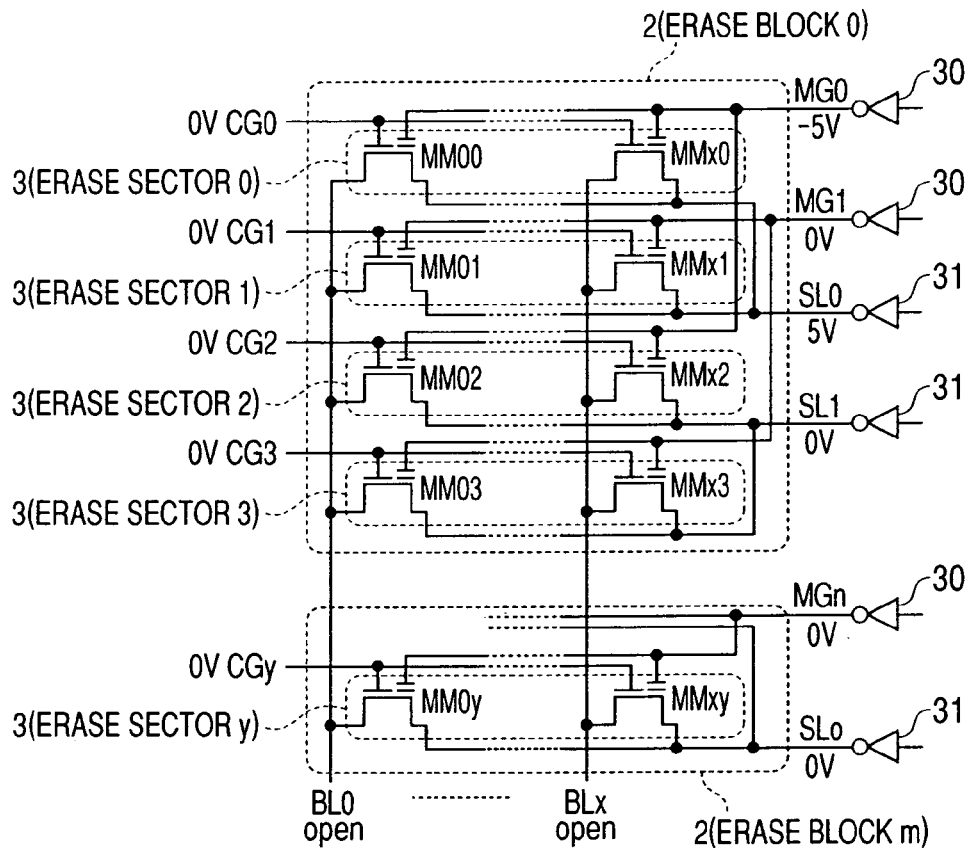
FIG. 7 is a circuit diagram showing the details of the memory array in which the divided erase block has a plurality of erase sectors.

FIG. 7 shows the detail of the memory array in which the divided erase block has a plurality of erase sectors. The structure of erase block 0 is a structure corresponding to FIG. 6. The source lines SL0 and SL1 are shareably connected to the adjacent two erase sectors. The memory gate lines MG0 and MG1 are shareably connected to the odd-numbered or even-numbered two erase sectors. When specifying the source line SL and the memory gate line MG to apply erasing voltages, the erase sector in which both erasing voltages are applied in parallel is erased. An erase block m has one erase sector.

The split gate nonvolatile memory cells MM (MM00 to MMxy) are arrayed in lattice form. The control gate, the memory gate and the source of the split gate nonvolatile memory cell (simply, called a memory cell) are shareably connected to each of the memory cells in the row direction. The control gate lines are indicated as CG0, CG1, CG2, CG3 and CGy, the memory gate lines are indicated as MG0, MG1 and MGn, and the source lines are indicated as SL0, SL1 and SLo. The drains of the memory cells are connected to the bit lines BL0 and BLx and are shareably connected in the column direction.

In the structure of FIG. 7, the memory cells MM00, MMx0, MM01, MMx1, MM02, MMx2, MM03 and MMx3 constitute erase block 0. The control gates of the memory cells are connected to the control gate lines CG0, CG1, CG2 and CG3. The memory gates thereof are connected to the memory gate lines MG0 and MG1. The sources thereof are connected to the source lines SL0 and SL1. Likewise, the memory cells MM0y and MMxy constitute erase block m. The control gates of the memory cells are connected to the control gate line CGy. The memory gates thereof are connected to the memory gate line MGn. The sources thereof are connected to the source line SLo. The memory cells MM00 to MMx0 constitute erase sector 0. The select gates of the memory cells are shareably connected to the control gate line CG0. The memory gates thereof are shareably connected to the memory gate line MG0. The sources thereof are shareably connected to the source line SL0. Likewise, the memory cells MM01 to MMx1 constitute erase sector 1. The control gates of the memory cells are shareably connected to the control gate line CG1. The memory gates thereof are shareably connected to the memory gate line MG1. The sources thereof are shareably connected to the source line SL0. The memory cells MM02 to MMx2 constitute erase sector 2. The memory cells MM03 to MMx3 constitute erase sector 3. The memory cells MM0y to MMxy constitute erase sector. The control gates of the memory cells are shareably connected to the control gate line CGy. The memory gates thereof are shareably connected to the memory gate line MGn. The sources thereof are shareably connected to the source line SLo.

When erasing the memory cells MM00 to MMx0 in the erase sector 0, $-5V$ is applied to the memory gate line MG0, 5V is applied to the source line SL0, 0V is applied to the control gate line CG0, and the bit lines BL0 and BLx are open. In the state that $-5V$ is applied to the memory gate line MG0, $-5V$ is also applied to the memory gates of the memory cells MM02 to MMx2 in the erase sector 2 shareably connected to the memory gate line MG0. The memory cells are not erased since 0V is applied to the sources of the memory cells via the source line SL1. 5V is applied to the sources of the memory cells MM01 to MMx1 in the erase sector 1. The memory cells are not erased since 0V is applied to the memory gates via the memory gate line MG1. In the erase sectors 3 and y, the memory cells are not erased since the control gate line CG, the memory gate line MG and the source line SL are all 0V.

The structure of FIG. 7 can be of the bit line hierarchical structure by connecting the bit line to the hierarchical MOS transistor. The adjacent erase sectors are connected to the source line SL and the respective memory gate lines MG are connected to the source line SL. Alternatively, the adjacent erase sectors are connected to the memory gate line MG and the respective source lines SL are connected to the memory gate line MG.

Figure 8:
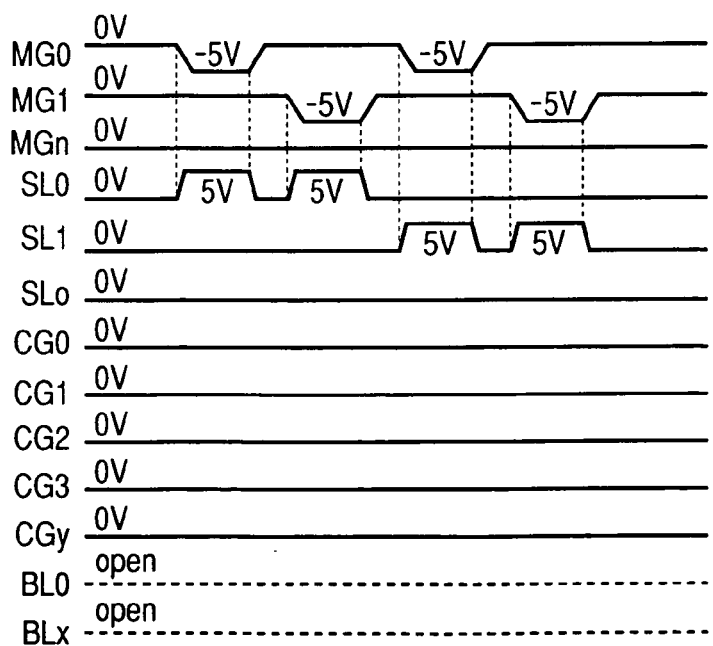
FIG. 8 is a timing chart of erase operation to the erase block of FIG. 7.

FIG. 8 shows a timing chart of erase in the erase block 0 of FIG. 7. First, the select gate lines CG0, CG1, CG2, CG3 and CGy are 0V and the bit lines BL0 to BLx are open. Next, to erase the erase sector 0, at the same timing, $-5V$ is applied to the memory gate line MG0 and 5V is applied to the source line SL0, which is held in time optimum for erase of the memory cells MM00 to MMx0. When erase of the memory cells MM00 to MMx0 in the erase sector 0 is completed, to erase the memory cells MM01 to MMx1 in the erase sector 1, at the same timing, −5V is applied to the memory gate line MG1 and 5V is applied to the source line SL0. To erase the memory cells MM02 to MMx2 in the erase sector 2, −5V is applied to the memory gate line MG0 and 5V is applied to the source line SL1. To erase the memory cells MM03 to MMx3 in the erase sector 3, −5V is applied to the memory gate line MG1 and 5V is applied to the source line SL1. As described above, the memory cells in all the erase sectors in the erase block 0 are erased.

There are various timings for applying voltages to the memory gate line MG and the source line SL. −5V is applied to the memory gate line MG to apply a voltage to the source line SL. Alternatively, 5V is applied to the source line SL to apply a voltage to the memory gate line MG. Further, a voltage is applied to the source line SL to reach an arbitrary voltage, and a voltage is then applied to the memory gate MG. A voltage is applied to the memory gate line MG to reach an arbitrary voltage, and a voltage is then applied to the source line SL.

Figure 9A:
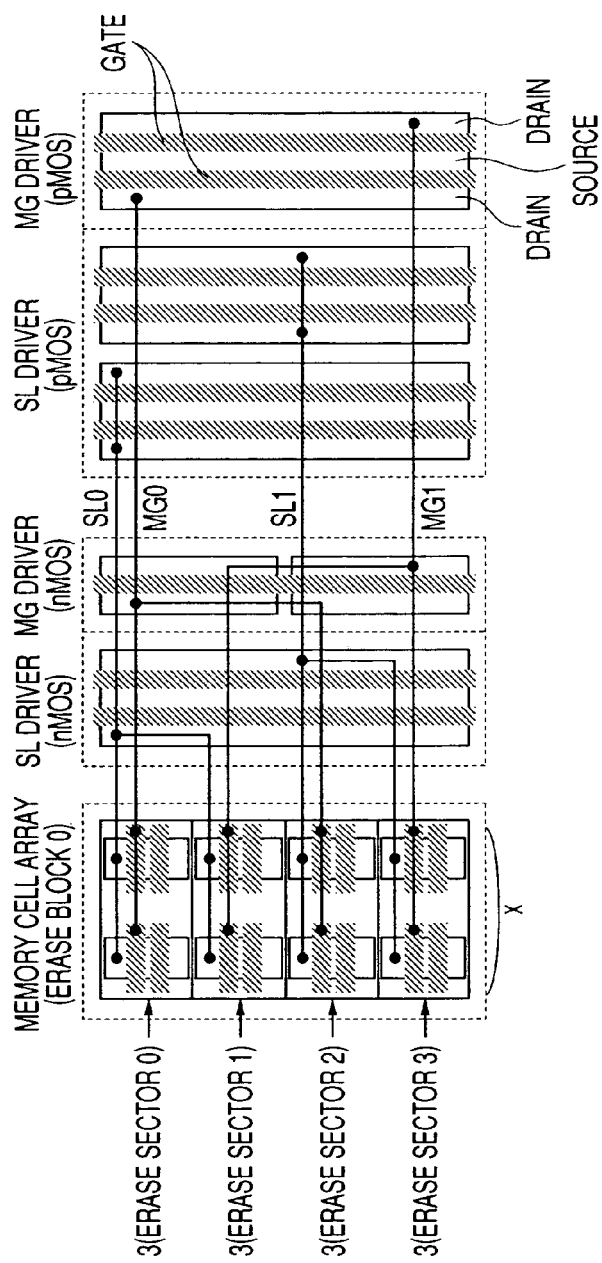
FIG. 9A is a plan view showing a layout example of the memory gate drivers, source line drivers and memory cells in the circuit structure example of FIG. 7.
Figure 9B:
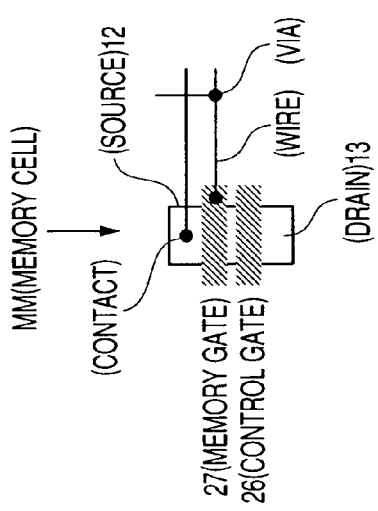
FIG. 9B is a plan view showing by extracting a layout example of one memory cell.

FIG. 9A shows a layout example of the drivers 30 and 31 of the memory gate line MG and the source line SL and the memory cells in the circuit structure example of FIG. 7. FIG. 9B extracts a layout example of one memory cell. One driver drives two source lines SL or memory gate lines MG. Erase is performed by applying voltages to the source line SL and the memory gate line MG at the same time. A combination of the source line SL and the memory gate line MG is changed to select the erase sector. The memory cell MM is that shown in FIG. 3A. There are two kinds of gates of the memory gate and the control gate. The diffusion layer on the memory gate side is the source and the diffusion layer on the control gate side is the drain. In lattice form, x memory cells are arranged in the row direction and four memory cells are arranged in the column direction. The source and the memory gate are shareably connected in the row direction. The memory gate is connected to the memory gate line MG and the source is connected to the source line SL. Although not shown, the control gate and the drain are connected to wires, respectively. The memory cells in one row constitute one erase sector. Four erase sectors constitute one block. The driver connected to the source line SL is the source driver (SL driver) 31. The driver connected to the memory gate line MG is the memory gate driver (MG driver) 30.

The drivers 31 and 30 driving the source line SL and the memory gate line MG construct one set of an n-channel MOS transistor (nMOS) and a p-channel MOS transistor (pMOS). Although not shown, the sources of the respective MOS transistors are connected to power source. Since electric currents are flowed to a plurality of memory cells at the same time, the channel width of the drivers 30 and 31 is larger than that of the memory cell MM. The size is determined by the number of memory cells connected to the source line SL in parallel. In FIG. 9A, the source driver 31 is larger than the memory gate driver 30. This is because an electric current is injected from the source of the memory cell at both write and erase, the current supply ability of the source line SL must be increased and the memory gate needs no large electric current.

In the layout example of FIG. 9A, one source line SL is connected to the source of the memory cell in one column. Possible is a layout in which the sources of two memory cells arrayed in the column direction are shared and one source line SL is connected to the sources of the memory cells in two columns.

The drivers 30 and 31 are shared between a plurality of erase sectors to reduce the layout area. Without sharing the drivers 30 and 31 as shown in FIG. 9A, the drivers 30 and 31 are specific in each erase sector. The layout area of the drivers 30 and 31 is increased.

Figure 10:
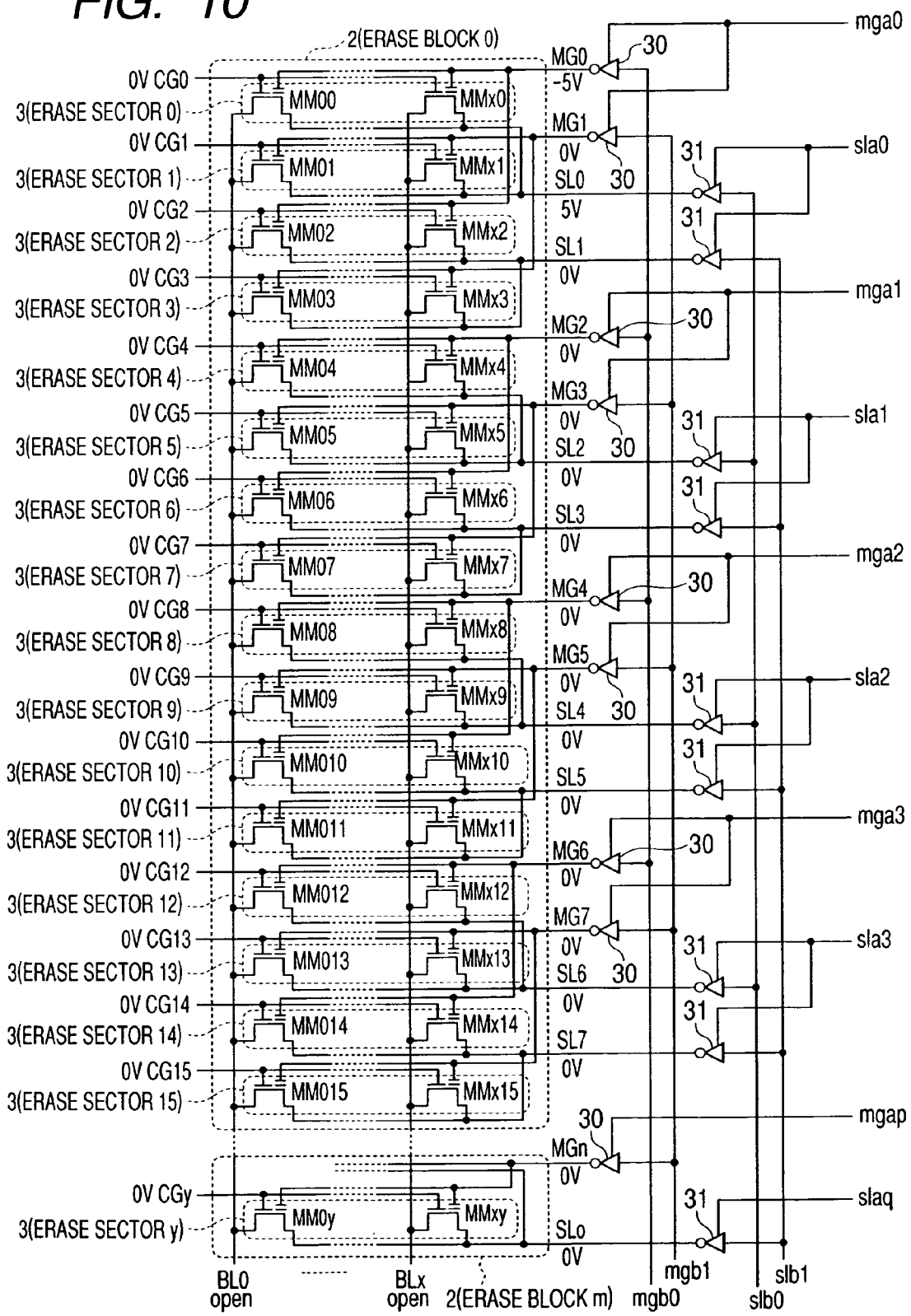
FIG. 10 is a circuit diagram showing an example in which the memory array is divided into erase blocks, the erase block has erase sectors, and the drivers connected to memory cell terminals are hierarchical.

FIG. 10 shows an example in which the memory array is divided into erase blocks, the erase block has erase sectors, and the drivers connected to the memory cell terminals are hierarchical. Erase block 0 has 16 erase sectors 3. When not performing hierarchization of the drivers, eight signals of the memory gate lines MG and eight signals of the source lines SL, that is, 16 signals are controlled. Hierarchization is performed to control 12 signals fewer than the number of erase sectors. When the number of erase sectors or erase blocks is increased, this effect can be higher.

The memory gate line MG0 is connected to the driver 30 in which select signals are mga0 and mgb0. Only when selecting mga0 and mgb0 at the same time, the driver 30 applies an erasing voltage to the memory gate line MG0. Likewise, a voltage is applied to the memory gate line MG1 when selecting mga0 and mgb1 at the same time. A voltage is applied to the memory gate line MG2 when selecting mga1 and mgb0 at the same time. A voltage is applied to the memory gate line MG3 when selecting mga1 and mgb1 at the same time. A voltage is applied to the memory gate line MG4 when selecting mga2 and mgb0 at the same time. A voltage is applied to the memory gate line MG5 when selecting mga2 and mgb1 at the same time. A voltage is applied to the memory gate line MG6 when selecting mga3 and mgb0 at the same time. A voltage is applied to the memory gate line MG7 when selecting mga3 and mgb1 at the same time. A voltage is applied to the memory gate line MGn when selecting mgap and mgb1 at the same time. A voltage is applied to the source line SL0 when selecting sla0 and slb0 at the same time. A voltage is applied to the source line SL1 when selecting sla0 and slb1 at the same time. A voltage is applied to the source line SL2 when selecting sla1 and slb0 at the same time. A voltage is applied to the source line SL3 when selecting sla1 and slb1 at the same time. A voltage is applied to the source line SL4 when selecting sla2 and slb0 at the same time. A voltage is applied to the source line SL5 when selecting sla2 and slb1 at the same time. A voltage is applied to the source line SL6 when selecting sla3 and slb0 at the same time. A voltage is applied to the source line SL7 when selecting sla3 and slb1 at the same time. A voltage is applied to the source line SLo when selecting slaq and slb1 at the same time.

When erasing the memory cells MM00 to MMx0 in erase sector 0, mga0 and mgb0 are selected to apply −5V to the memory gate line MG0, sla0 and slb0 are selected to apply 5V to the source line SL0, 0V is applied to the select gate line CG0, and the bit lines BL0 to BLx are open. To change the erase sector to be erased, a combination of mga and mgb or sla and slb is changed. In FIG. 10, the signals selecting the memory gate line MG and the source line SL in the erase block 0 are mga0, mga1, mga2, mga3, mgb0 and mgb1, and sla0, sla1, sla2, sla3, slbo and slb1. Other structures are possible. One memory gate line MG and one source line SL may be independently selected. The memory gate lines MG are of the same structure as that of FIG. 10. The source lines SL are sla0, sla1, sla2, sla3, sla4, sla5, sla6, sla7 and slbo. The source line SL0 is selected by sla0 and slb0. The source line SL1 is selected by sla1 and slb0. The source line SL2 is selected by sla2 and slb0. The source line SL3 is selected by sla3 and slb0. The source line SL4 is selected by sla4 and slb0. The source line SL5 is selected by sla5 and slb0. The source line SL6 is selected by sla6 and slb0. The source line SL7 is selected by sla7 and slb0.

Figure 11:
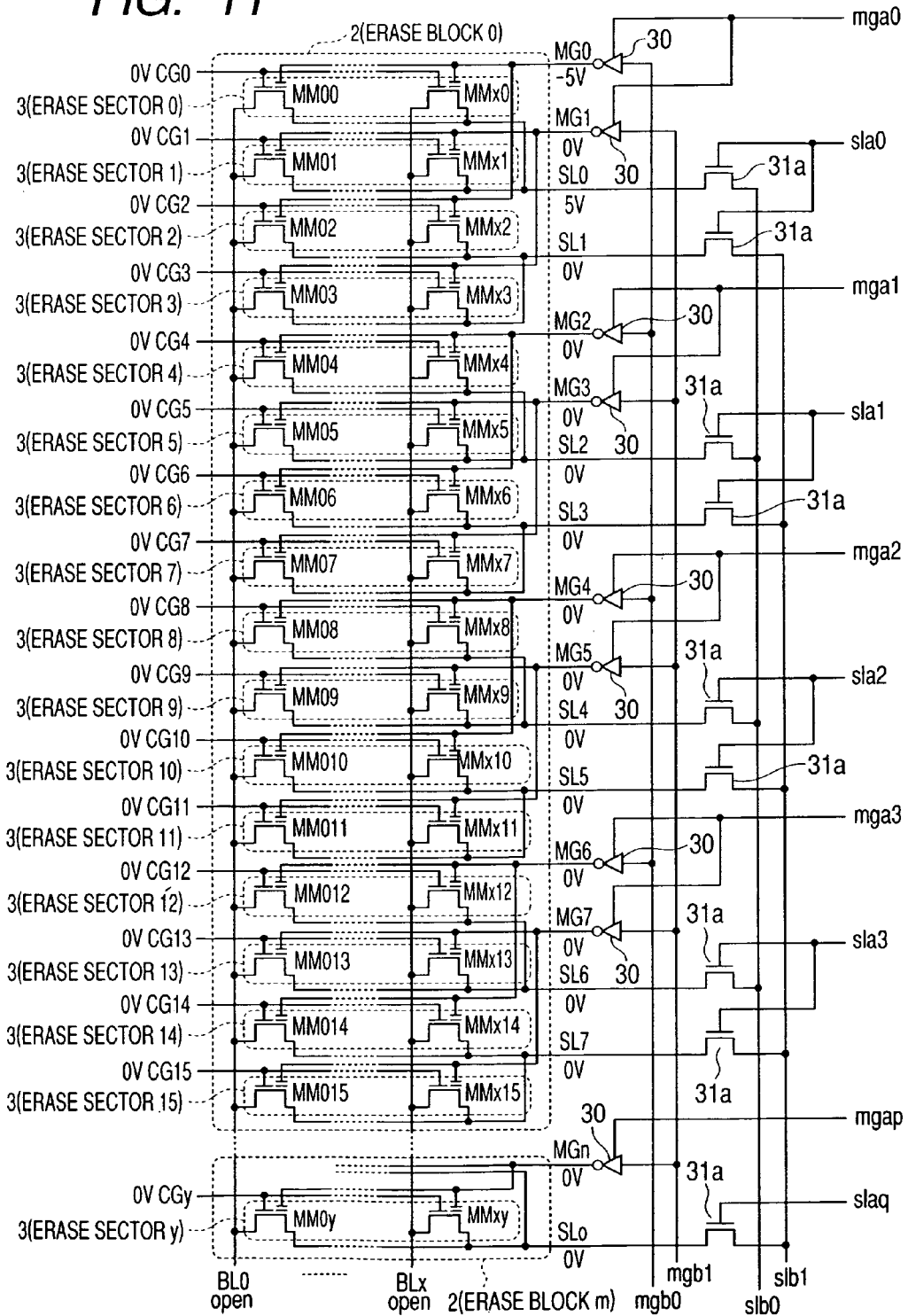
FIG. 11 is a circuit diagram showing another example in which the memory array is divided into erase blocks, the erase block has erase sectors, and the drivers connected to memory cell terminals are hierarchical.

FIG. 11 shows another example in which a memory array is divided into erase blocks, the erase block has erase sectors, and the drivers connected to the memory cell terminals are hierarchical. In the same memory array structure as that of FIG. 9, the erase block 0 has 16 erase sectors 3. The selection driving of the source line SL is performed by an nMOS 31a, which is different from FIG. 10. An erasing voltage applied to the source line SL is directly transmitted to the signal lines sla and slb.

The memory gate lines MG are of the same structure as that of FIG. 10. The gate of the source line SL is connected to the sla and the slb is connected to the nMOS of the drain. A method of selecting the source line SL is the same as that of FIG. 10.

When erasing the memory cells MM00 to MMx0 in erase sector 0, mga0 and mgb0 are selected to apply −5V to the memory gate line MG0, sla0 and slb0 are selected to apply 5V to the source line SL0, 0V is applied to the select gate line CG0, and the bit lines BL0 to BLx are open. To change the erase sector to be erased, a combination of mga and mgb or sla and slb is changed. In FIG. 11, the signals selecting the memory gate lines MG and the source lines SL in the erase block 0 are mga0, mga1, mga2, mga3, mgb0 and mgb1 and sla0, sla1, sla2, sla3, slb0 and slb1. Other structures are possible. One memory gate line MG and one source line SL may be independently selected. The memory gate lines MG are of the same structure. The source line SL is selected by sla0, sla1, sla2, sla3, sla4, sla5, sla6, sla7 and slb0. The source line SL0 is selected by sla0 and slb0. The source line SL1 is selected by sla1 and slb0. The source line SL2 is selected by sla2 and slb0. The source line SL3 is selected by sla3 and slb0. The source line SL4 is selected by sla4 and slb0. The source line SL5 is selected by sla5 and slb0. The source line SL6 is selected by sla6 and slb0. The source line SL7 is selected by sla7 and slb0.

In FIG. 11, in the state that the source line SL0 is selected, the sla0 and slb0 are selected and the sla1, sla2, sla3 and slb1 are not selected. At this time, the source lines SL2, SL3, SL4, SL5, SL6 and SL7 are in the open state. A voltage lower than that of the selected signals is applied to the unselected sla1, sla2, sla3 and slb1 to eliminate the open state. By way of example, when the SL0 is selected, the sla0 is 7V, the slb0 is 5V, and the sla1, sla2, sla3 and slb1 are 0V, the SL2, SL3, SL4, SL5, SL6 and SL7 are in the open state. When 3V is applied to the unselected sla1, sla2, sla3 and slb1, the open state of the source lines SL2, SL3, SL4, SL5, SL6 and SL7 can be eliminated.

Figure 12:
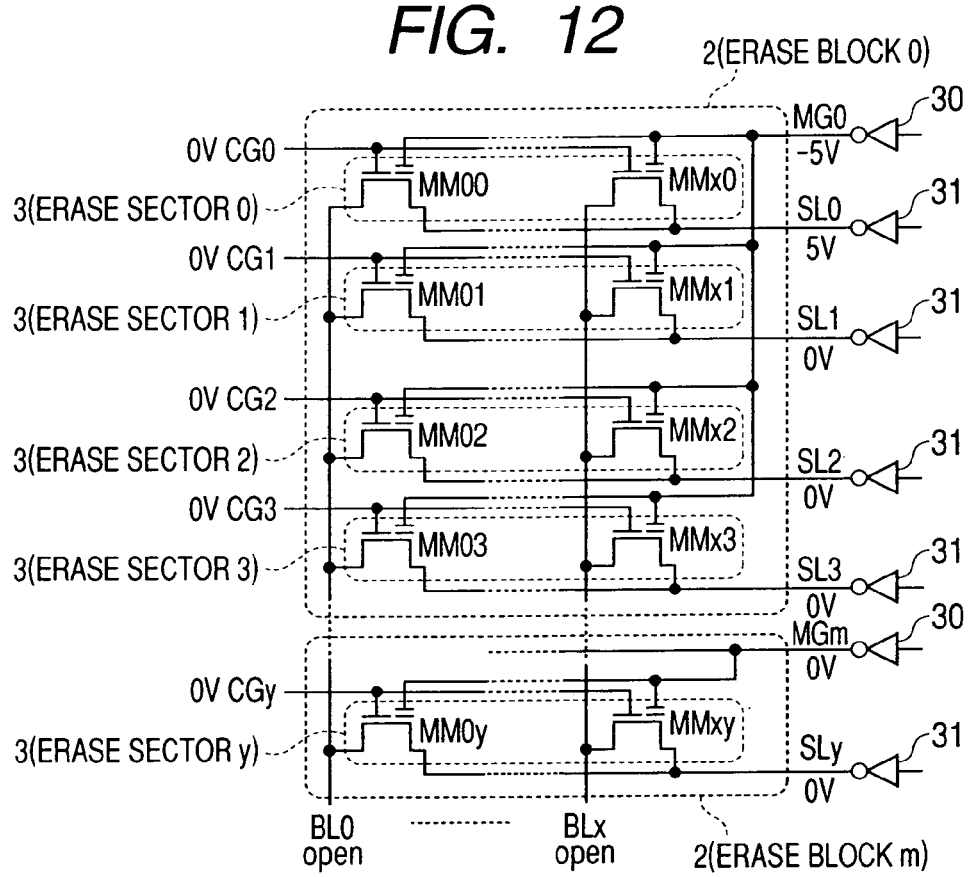
FIG. 12 is a circuit diagram showing another example of an erasing circuit structure in which the erase block is divided into the erase sectors.

FIG. 12 shows another example of an erasing circuit structure in which the erase block is divided into the erase sectors. The memory cells MM are arrayed in lattice form and the control gates 26, the memory gates 27 and the sources 22 of the memory cells are shareably connected in the row direction. The control gate lines are indicated as CG0, CG1, CG2, CG3 and CGy, the memory gate lines are indicated as MG0 and MGm, and the source lines are indicated as SL0, SL1, SL2, SL3 and SLy. The drains 23 of the memory cells MM are connected to the bit lines BL0 to BLx and are shareably connected in the column direction.

The memory cells MM00, MMx0, MM01, MMx1, MM02, MMx2, MM03 and MMx3 constitute erase block 0. The control gates of the memory cells are connected to the control gate lines CG0, CG1, CG2 and CG3. The memory gates thereof are connected to the memory gate line MG0. The sources thereof are connected to the source lines SL0, SL1, SL2 and SL3. Likewise, the memory cells MM0y to MMxy constitute erase block m. The control gates of the memory cells are connected to the control gate line CGy. The memory gates thereof are connected to the memory gate line MGm. The sources thereof are connected to the source line SLy. The memory cells MM00 to MMx0 constitute erase sector 0. The control gates of the memory cells are shareably connected to the control gate line CG0. The memory gates thereof are shareably connected to the memory gate line MG0. The sources thereof are shareably connected to the source line SL0. Likewise, the memory cells MM01 to MMx1 constitute erase sector 1. The control gates are shareably connected to the control gate line CG1. The memory gates are shareably connected to the memory gate line MG0. The sources are shareably connected to the source line SL1. The memory cells MM02 to MMx2 constitute erase sector 2. The control gates are shareably connected to the control gate line CG2. The memory gates are shareably connected to the memory gate line MG0. The sources are shareably connected to the source line SL2. The memory cells MM03 to MMx3 constitute erase sector 3. The control gates are shareably connected to the control gate line CG3. The memory gates are shareably connected to the memory gate line MG0. The sources are shareably connected to the source line SL3. The memory cells MM0y to MMxy constitute erase sector y. The control gates are shareably connected to the control gate line CGy. The memory gates are shareably connected to the memory gate line MGm. The sources are shareably connected to the source line SLy.

When erasing the memory cells MM00 to MMx0 in the erase sector 0, −5V is applied to the memory gate line MG0, 5V is applied to the source line SL0, 0V is applied to the control gate line CG0, and the bit lines BL0 and BLx are open. In the state that −5V is applied to the memory gate line MG0, −5V is also applied to the memory gates of the memory cells MM01 to MMx1 in the erase sector 1, the memory cells MM02 to MMx2 in the erase sector 2, and the memory cells MM03 to MMx3 in the erase sector 3, which are shareably connected to the memory gate. The memory cells are not erased since 0V is applied to the sources of the memory cells via the source lines SL1, SL2 and SL3. In the erase sector y not to be erased, the memory cells are not erased since the memory gate line MGm and the source line SLy are both 0V. The structure of FIG. 12 can be a hierarchical structure by connecting the bit lines to the hierarchical MOS transistors.

Figure 13:
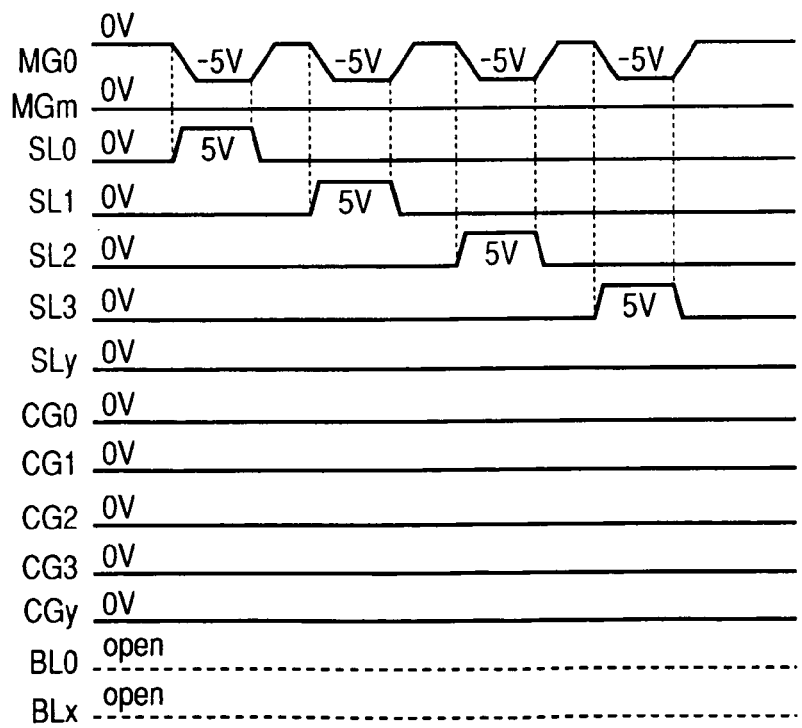
FIG. 13 is a timing chart of erase operation to the erase block of FIG. 12.

FIG. 13 shows a timing chart of erase in the erase block 0 of FIG. 12. First, the control gate lines CG0, CG1, CG2 and CG3 are 0V, and the bit lines BL0 and BLx are open. Next, to erase the erase sector 0, at the same timing, −5V is applied to the memory gate line MG0 and 5V is applied to the source line SL0, which is held in time optimum for erasing the memory cells MM00 to MMx0. When completing of erase of the memory cells MM00 to MMx0 in the erase sector 0, to erase the memory cells MM01 to MMx1 in the erase sector 1, −5V is applied to the memory gate line MG0 and 5V is applied to the source line SL1. To erase the memory cells MM02 to MMx2 in the erase sector 2, at the same timing, −5V is applied to the memory gate line MG0 and 5V is applied to the source line SL2. To erase the memory cells MM03 to MMx3 in the erase sector 3, at the same timing, −5V is applied to the memory gate line MG0 and 5V is applied to the source line SL3. The memory cells in all the erase sectors in the erase block 0 are erased to complete erase of the erase block 0.

There are various timings for applying voltages to the memory gate line MG and the source line SL. −5V is applied to the memory gate line MG to apply a voltage to the source line SL. Alternatively, 5V is applied to the source line SL to apply a voltage to the memory gate line MG. A voltage is applied to the source line SL to reach an arbitrary voltage, and a voltage is then applied to the memory gate MG. A voltage is applied to the memory gate line MG to reach an arbitrary voltage, and a voltage is then applied to the source line SL.

Figure 14:
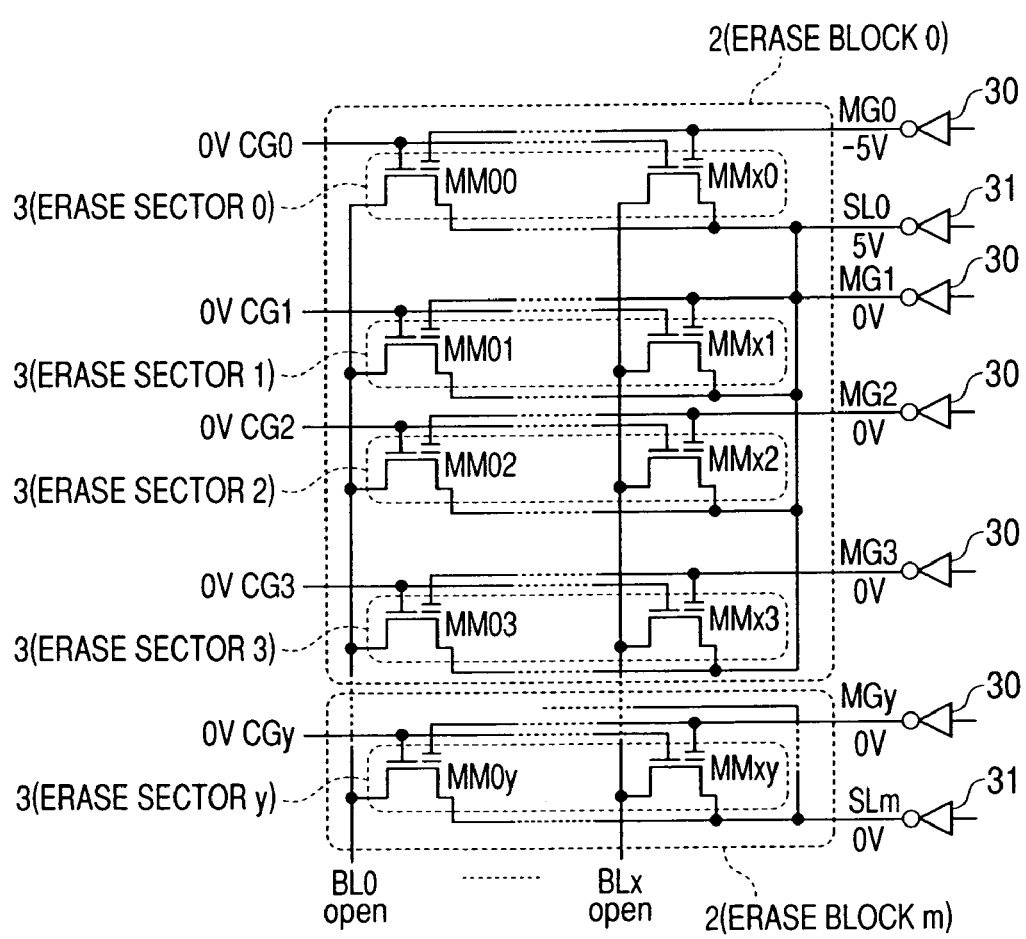
FIG. 14 is a circuit diagram showing a further example of an erasing circuit structure in which the erase block is divided into the erase sectors.

FIG. 14 shows a further example of an erasing circuit structure in which the erase block is divided into the erase sectors. The memory cells MM are arrayed in lattice form and the control gates, the memory gates and the sources of the memory cells are shareably connected in the row direction. The control gate lines are indicated as CG0, CG1, CG2, CG3 and CGy, the memory gate lines are indicated as MG0, MG1, MG2, MG3 and MGy, and the source lines are indicated as SL0 and SLn. The drains of the memory cells are connected to the bit lines BL0 and BLx and are shareably connected in the column direction.

The memory cells MM00, MMx0, MM01, MMx1, MM02, MMx2, MM03 and MMx3 constitute erase block 0. The memory cells MM0y and MMxy constitute erase block m. The memory cells MM00 and MMx0 constitute erase sector 0. The control gates of the memory cells are shareably connected to the control gate line CG0. The memory gates thereof are shareably connected to the memory gate line MG0. The sources thereof are shareably connected to the source line SL0. Likewise, the memory cells MM01 and MMx1 constitute erase sector 1. The control gates are shareably connected to the control gate line CG1. The memory gates are shareably connected to the memory gate line MG1. The sources are shareably connected to the source line SL0. The memory cells MM02 and MMx2 constitute erase sector 2. The control gates are shareably connected to the control gate line CG2. The memory gates are shareably connected to the memory gate line MG2. The sources are shareably connected to the source line SL0. The memory cells MM03 and MMx3 constitute erase sector 3. The control gates are shareably connected to the control gate line CG3. The memory gates are shareably connected to the memory gate line MG3. The sources are shareably connected to the source line SL0. The memory cells MM0y and MMxy constitute erase sector m. The memory gates are shareably connected to the memory gate line MGy. The sources are shareably connected to the source line SLm.

When erasing the memory cells MM00 and MMx0 in the erase sector 0, 5V is applied to the source line SL0, −5V is applied to the memory gate line MG0, 0V is applied to the control gate line CG0, and the bit lines BL0 and BLx are open. In the state that 5V is applied to the source line SL0, 5V is also applied to the sources of the memory cells MM01 and MMx1 in the erase sector 1, the memory cells MM02 and MMx2 in the erase sector 2, and the memory cells MM03 and MMx3 in the erase sector 3, which are shareably connected to the source. The memory cells are not erased since 0V is applied to the memory gates of the memory cells via the memory gate lines MG1, MG2 and MG3. In the erase sector y not to be erased, the memory cells are not erased since the source line SLm and the memory gate line MGy are both 0V. The structure of FIG. 14 can be a hierarchical structure by connecting the bit lines BL to the hierarchical MOS transistors.

Figure 15A:
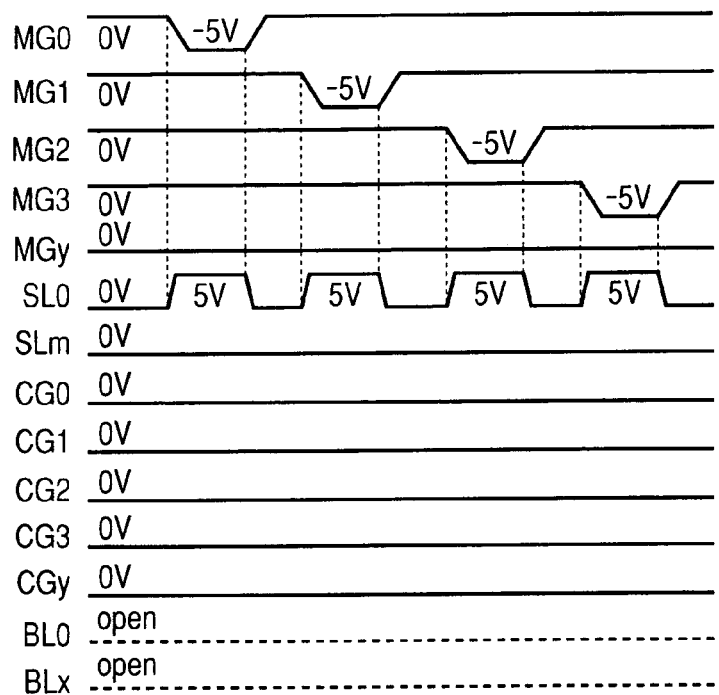
FIG. 15A is a timing chart of erase operation to the erase block of FIG. 14.

FIG. 15A shows a timing chart of erase in the erase block 0 of FIG. 14. First, the control gate lines CG00, CG01, CG02, CG03 and CGy are 0V, and the bit lines BL0 and BLx are open. Next, to erase the erase sector 0, at the same timing, 5V is applied to the source line SL0 and −5V is applied to the memory gate line MG0, which is held in time optimum for erasing the memory cells MM00 and MMx0. When completing of erase of the memory cells MM00 and MMx0 in the erase sector 0, to erase the memory cells MM01 and MMx1 in the erase sector 1, 5V is applied to the source line SL0 and −5V is applied to the memory gate line MG1. To erase the memory cells MM02 and MMx2 in the erase sector 2, 5V is applied to the source line SL0 and −5V is applied to the memory gate line MG2. To erase the memory cells MM03 and MMx3 in the erase sector 3, 5V is applied to the source line SL0 and −5V is applied to the memory gate line MG3. As described above, the memory cells in all the erase sectors in the erase block 0 are erased.

Figure 15B:
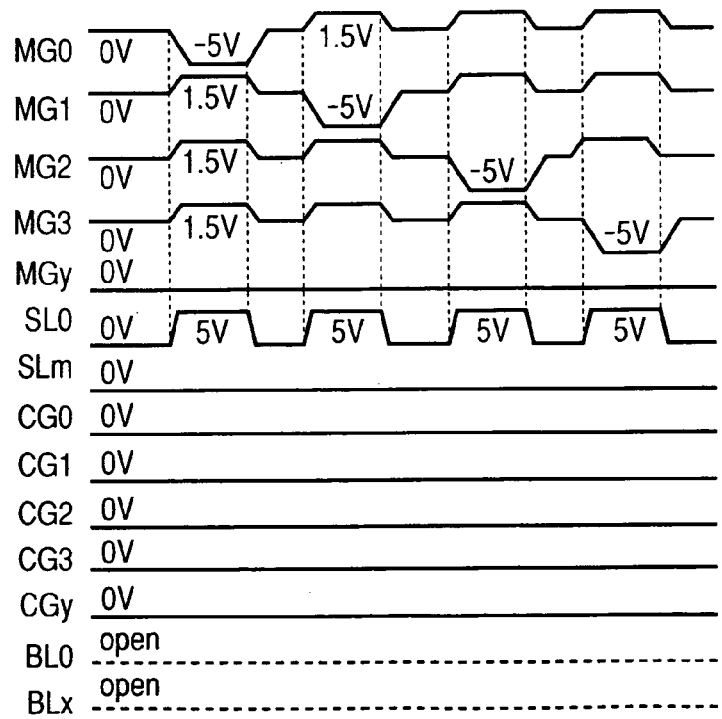
FIG. 15B is a timing chart of another erase operation to the erase block of FIG. 14.

There are various timings for applying voltages to the source line SL and the memory gate line MG. A voltage is applied to the source line SL to apply a voltage to the memory gate line MG. Alternatively, −5V is applied to the memory gate line MG to apply a voltage to the source line SL. Further, a voltage is applied to the source line SL to reach an arbitrary voltage, and a voltage is then applied to the memory gate MG. A voltage is applied to the memory gate line MG to reach an arbitrary voltage, and a voltage is then applied to the source line SL. FIG. 15B shows another example of erase operation of the erase circuit structure of FIG. 14, which is a method of applying a voltage of 1.5V to the memory gate line of the unselected sector in the block to be erased. The magnitude of an undesired electric field applied to the sector not to be erased in erase operation can be reduced.

Figure 16:
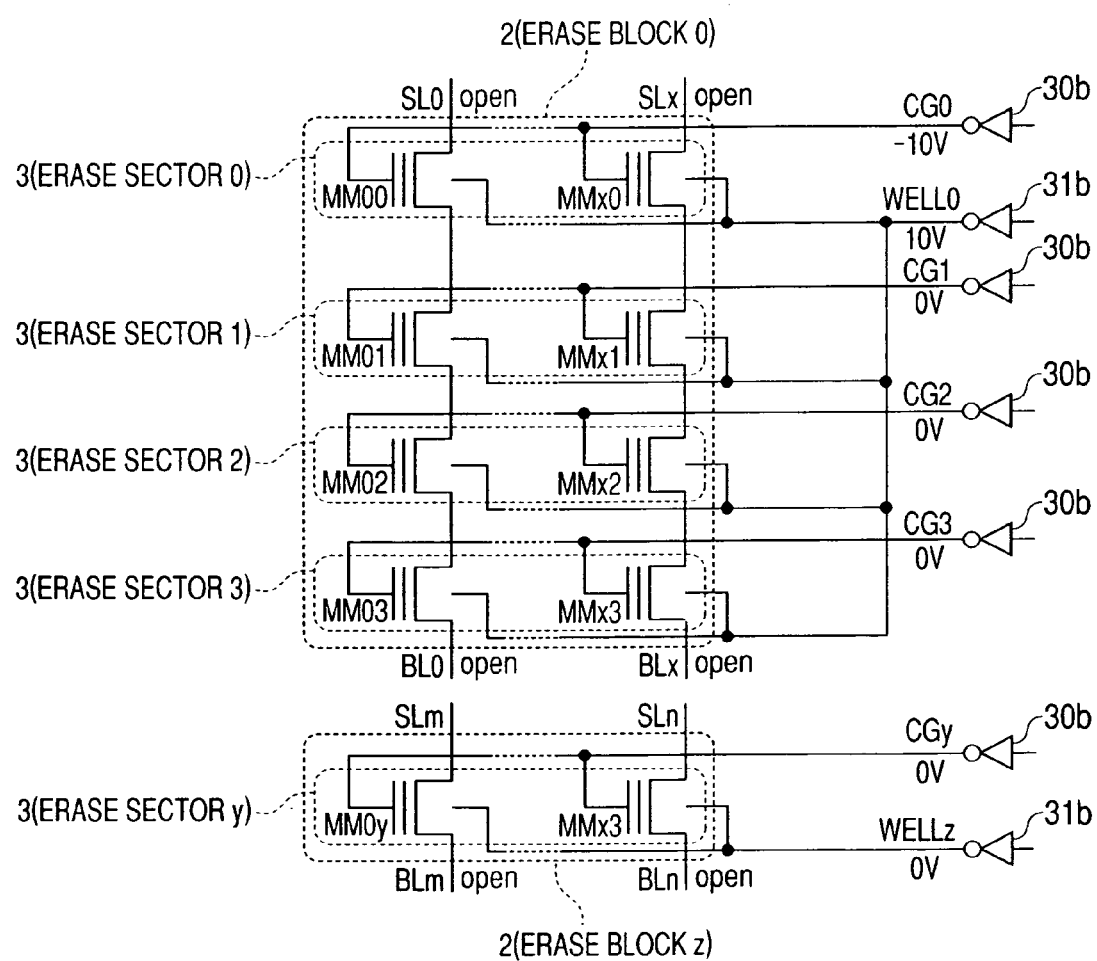
FIG. 16 is a circuit diagram showing a furthermore example of an erasing circuit structure in which the erase block is divided into the erase sectors.

FIG. 16 shows a furthermore example of an erasing circuit structure in which the erase block is divided into the erase sectors. A nonvolatile memory cell used here is of a stacked gate structure. The method of erasing the memory cell shown in FIG. 2B is used. The memory cells MM are arrayed in lattice form, the control gates 10 of the memory cell are connected in the row direction, and the drains 13 and the sources 12 are connected in the column direction. The wells 14 are connected to each erase block. The control gate lines are indicated as CG0, CG1, CG2, CG3 and CGy, the source lines are indicated as SL0, SLx, SLm and SLn, the bit lines are indicated as BL0, BLx, BLm and BLn, and the well lines are indicated as WELL0 and WELLz. In this structure, the wells 14 are isolated for each sector.

The memory cells MM00, MMx0, MM01, MMx1, MM02, MMx2, MM03 and MMx3 constitute erase block 0. The memory cells MM0y and MMxy constitute erase block z. The memory cells MM00 and MMx0 constitute erase sector 0. The control gates of the memory cells are connected to the control gate line CG0. The wells thereof are connected to the well line WELL0. Likewise, the memory cells MM01 and MMx1 constitute erase sector 1. The control gate line CG1 is shareably connected to the well line WELL0. The memory cells MM02 and MMx2 constitute erase sector 2. The control gate line CG2 is shareably connected to the well line WELL0. The memory cells MM03 and MMx3 constitute erase sector 3. The control gate line CG3 is shareably connected to the well line WELL0. The memory cells MM0y and MMxy constitute erase sector y. The control gates are shareably connected to the control gate line CGy. The wells are shareably connected to the well line WELLz. The well lines WELL0 and WELL1 are driven by specific well drivers 31*b*. The control gate lines CG0 to CGy are driven by specific drivers 30*b*. Both the drivers 31*b* and 30*b* are both high voltage drivers.

When erasing the memory cells MM00 to MMx0 in the erase sector 0, the source line SL and the bit line BL are open, −10V is applied to the control gate line CG0, and 10V is applied to the well line WELL0. In the state that 10V is applied to the well line WELL0, 10V is also applied to the wells of the memory cells MM01, MMx1, MM02, MMx2, MM03 and MMx3 in the erase sector 0 shareably connected to the well. The memory cells are not erased since 0V is applied to the control gates of the memory cells via the control gate lines CG1, CG2 and CG3. In the erase sector y not to be erased, the memory cells are not erased since the control gate line CGy and the well line WELLz are both 0V.

Figure 17:
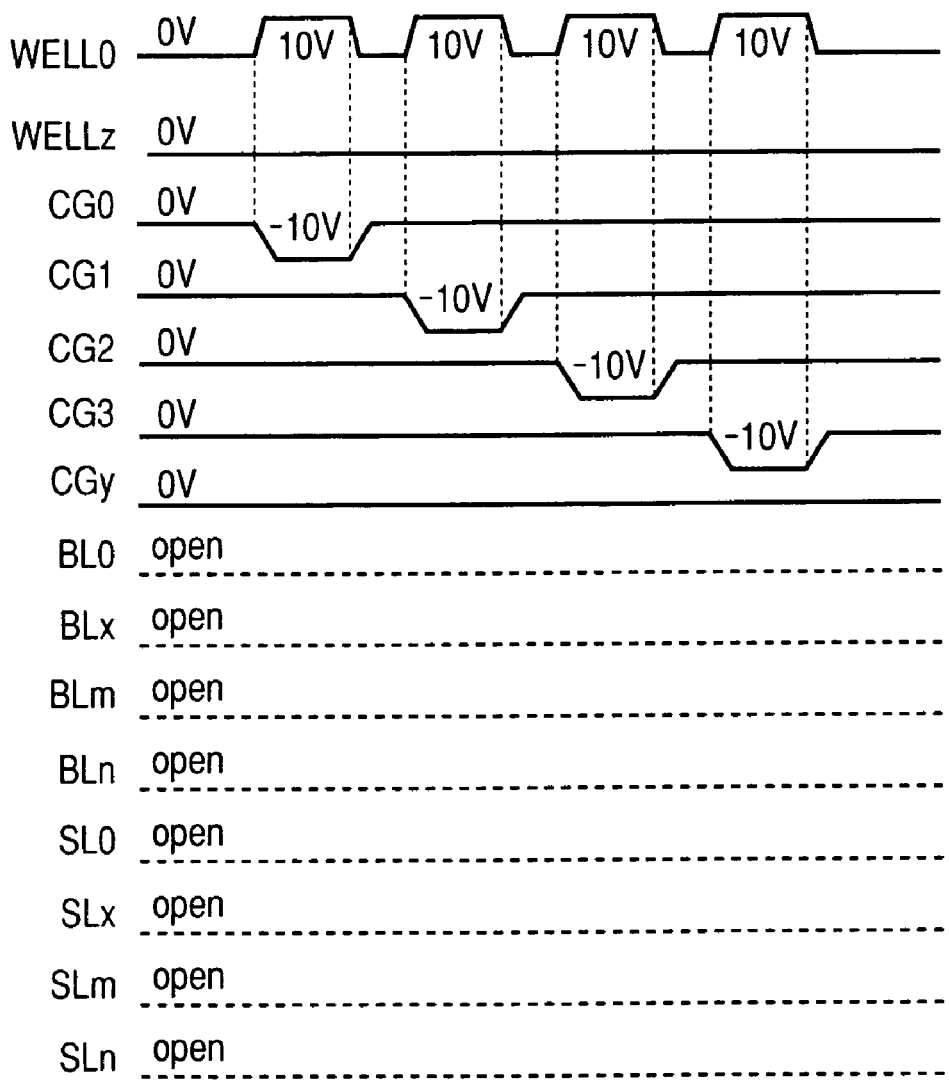
FIG. 17 is a timing chart of erase operation to the erase block of FIG. 16.

FIG. 17 shows a timing chart of erase in the erase block 0 of FIG. 16. First, the source lines SL0, SLx, SLm and SLn and the bit lines BL0, BLx, BLm and BLn are open. Next, to erase the erase sector 0, at the same timing, −10V is applied to the control gate line CG0 and 10V is applied to the well line WELL0, which is held in time optimum for erasing the memory cells MM00 and MMx0. When completing erase of the memory cells in the erase sector 0, to erase the memory cells in the erase sector 1, −10V is applied to the control gate line CG1 and 10V is applied to the well line WELL0. Likewise, voltages are applied to the erase sectors 2 and 3 to erase the memory cells in all the erase sectors in the erase block 0. Erase of the erase block 0 is completed.

Figure 18:
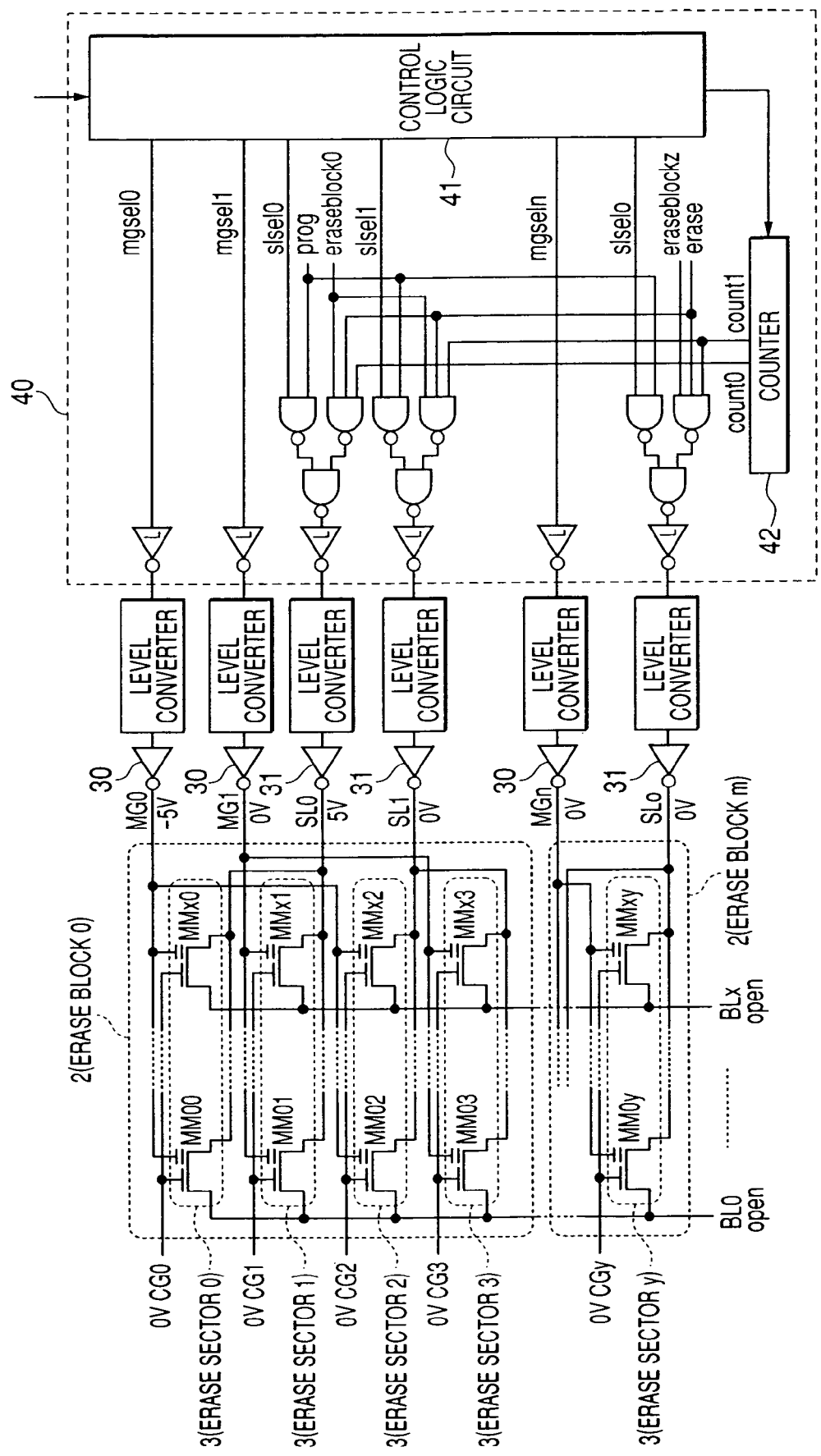
FIG. 18 is a logic circuit diagram showing a circuit structure in which an erase region is specified by the erase block in the memory array of FIG. 7 to time division control erase for each of the erase sectors.

FIG. 18 shows a circuit structure in which an erase region is specified by the erase block in the memory array of FIG. 7 to time division control erase for each of the erase sectors. The memory cells MM are arrayed in lattice form. The control gates, the memory gates and the sources of the memory cells are shareably connected in the row direction. The control gate lines indicated as CG0, CG1, CG2, CG3 and CGy, the memory gate lines are indicated as MG0, MG1 and MGn, and the source lines are indicated as SL0, SL1 and SLo. The drains of the memory cells are connected to the bit lines BL0 and BLx and are shareably connected in the column direction. A control circuit 40 controls time division erase for each erase sectors in the erase block. mgsel (mgsel0, mgsel1 and mgseln) is a memory gate line select signal, slsel (slsel0 and slsel1) is a source line select signal, prog is a write signal, erase is an erase signal, eraseblock (eraseblock0 and eraseblockz) is an erase block select signal, and count (count0 and count1) is a signal time division controlling erase for each erase sector. The slsel and prog of the signals are signals used at write.

The erase block to be erased is instructed by an erase command to the control circuit 40. A control logic circuit 41 decodes it to bring the erase block select signal eraseblock0 or the eraseblock1 to H level. In the first half of the H level period, the memory gate line select signal mgsel0 is at H level. In the latter half, mgsel1 is at H level. The count operation of a counter 42 is performed in one cycle in each H level period of each memory gate line select to change the time division control signals count0 and count1.

The memory cells MM00, MMx0, MM01, MMx1, MM02, MMx2, MM03 and MMx3 constitute erase block 0. The memory cells MM0y and MMxy constitute erase block m. The memory cells MM00 and MMx0 constitute erase sector 0. The control gates of the memory cells are shareably connected to the control gate line CG0. The memory gates thereof are shareably connected to the memory gate line MG0. The sources thereof are shareably connected to the source line SL0. Likewise, the memory cells MM01 and MMx1 constitute erase sector 1. The control gates are shareably connected to the control gate line CG1. The memory gates are shareably connected to the memory gate line MG1. The sources are shareably connected to the source line SL0. The memory cells MM02 and MMx2 constitute erase sector 2. The control gates are shareably connected to the control gate line CG2. The memory gates are shareably connected to the memory gate line MG0. The sources are shareably connected to the source line SL1. The memory cells MM03 and MMx3 constitute erase sector 3. The control gates are shareably connected to the control gate line CG3. The memory gates are shareably connected to the memory gate line MG1. The sources are shareably connected to the source line SL1. The memory cells MM0y and MMxy constitute erase sector y. The control gates are shareably connected to the control gate line CGy. The memory gates are shareably connected to the memory gate line MGn. The sources are shareably connected to the source line SLo.

When erasing the memory cells MM00, MMx0, MM01, MMx1, MM02, MMx2, MM03 and MMx3 in the erase block 0, the signals erase and eraseblock0 are at H level (high level, logic value "1"), and the signals slsel and prog are at L level (low level, logic value "0"). 0V is applied to the control gate line CG0, and the bit lines BL0 and BLx are open. The signal mgsel0 is at H level, and −5V is applied to the memory gate line MG0. When the signal count0 is at H level, 5V is applied to the source line SL0. In the state that −5V is applied to the memory gate line MG0, −5V is also applied to the memory gates of the memory cells MM02 and MMx2 in the erase sector 2 shareably connected to the memory gate. The memory cells are not erased since 0V is applied to the sources of the memory cells via the source line SL1. In the erase sector 1, 5V is applied to the source line SL0. The memory cells are not erased since 0V is applied to the memory gate line MG1. In the erase sectors 3 and y, the memory cells are not erased since the control gate line CGy, the memory gate line MGn and the source line SLo are all 0V. The output of the signal count0 is at L level when a fixed time elapses, and the voltage of the source line SL0 is 0V. The signal count1 is at H level, 5V is applied to the source line SL1, and the erase sector 2 is erased. After the signal count1 is at L level, the signal mgsel0 is at L level, and 0V is applied to the memory gate line MG0. The signal mgsel1 is at H level, and −5V is applied to the memory gate line MG1. The signals count0 and count1 are sequentially operated again to erase the erase sectors 1 and 3.

Figure 19:
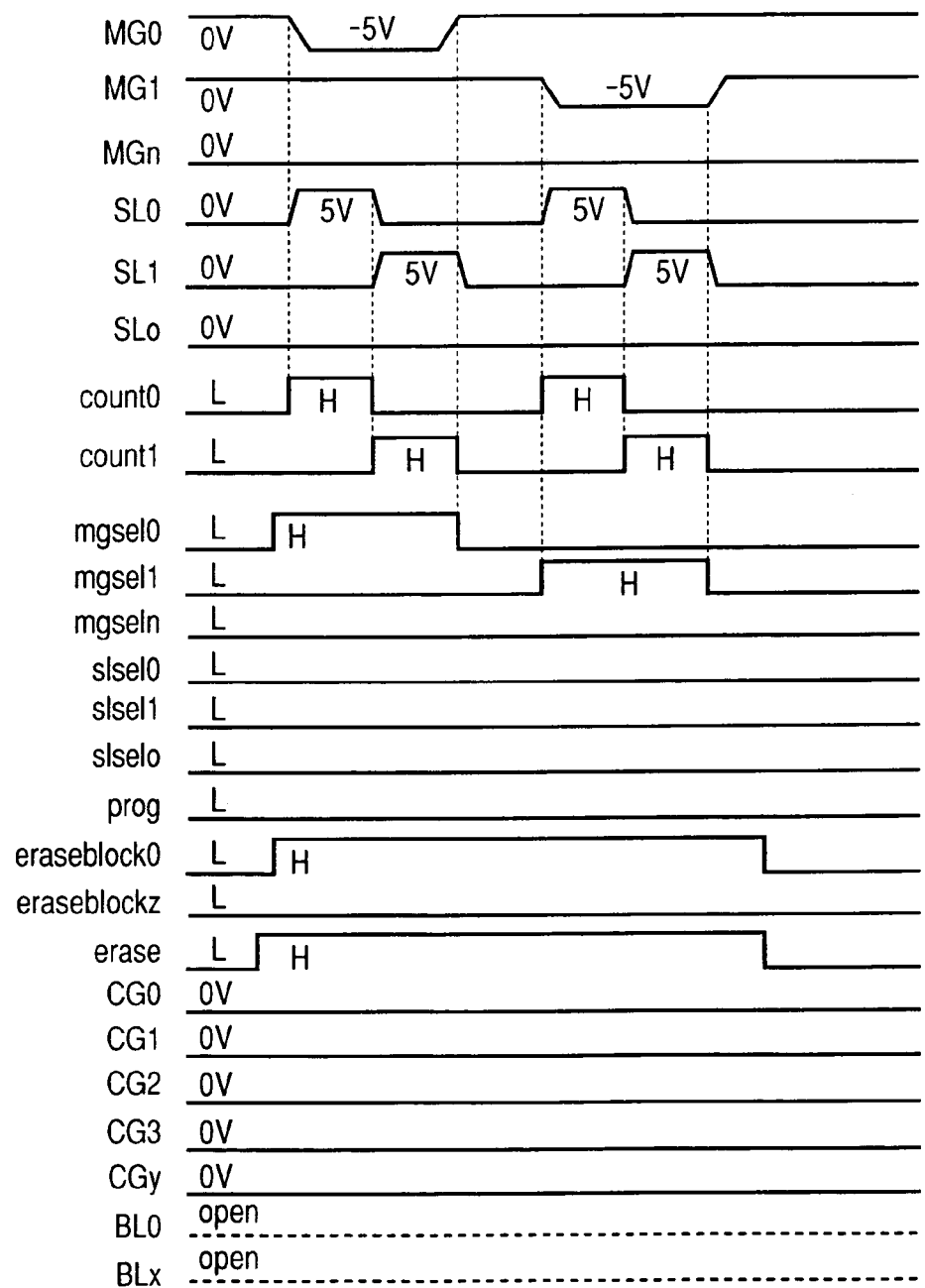
FIG. 19 is a timing chart of erase operation to the erase block of the circuit structure of FIG. 18.

FIG. 19 shows a timing of erase in the erase block 0 of the circuit structure of FIG. 18. To erase the memory cells MM00, MMx0, MM01, MMx1, MM02, MMx2, MM03 and MMx3 in the erase block 0, 0V is applied to the control gate lines CG0, CG1, CG2 and CG3, and the bit lines BL0 and BLx are open. The signal erase is at H level. The signal eraseblock0 is at H level to select the erase block 0. The signal mgsel0 is at H level, and −5V is applied to the memory gate line MG0. When the output of the signal count0 is at H level, 5V is applied to the source line SL0, and the memory cells MM00 and MMx0 are erased. The output of the signal count0 is at L level when an erase time elapses, and the voltage of the source line SL0 is 0V. The output of the signal count1 is at H level, and 5V is applied to the source line SL1. When completing erase of the memory cells in the erase sector 2, the signal mgsel0 is at L level, the signal mgsel1 is at H level, and the signals count0 and count1 are operated again to erase the memory cells in the erase sectors 1 and 3. When completing erase of the erase block 0, the signals mgsel1, eraseblock0 and erase are all at L level, and the memory gate line MG and the source line SL are both 0V. During erase of the erase block 0, the signal mgseln, slselo, prog and eraseblockz are at L level, and since the memory gate line MGn, the source line SLo and the control gate line CGy in the erase block m are 0V, the memory cells are not erased. The erase time for each sector can be changed by adjusting the H level period of the counter. In FIG. 19, application of a voltage to the source line SL1 is started when application of a voltage to the source line SL0 is completed. To shorten the erase time, start of application of a voltage to the source line SL1 is shifted from start of application of a voltage to the source line SL0 to apply the voltages to the source lines SL0 and SL1 at the same time.

In this structure, the adjacent erase sectors are connected to the source line SL, and the respective memory gate lines MG are connected to the source line SL. The adjacent erase sectors are connected to the memory gate line MG, and the respective source lines SL are connected to the memory gate line MG.

Figure 20:
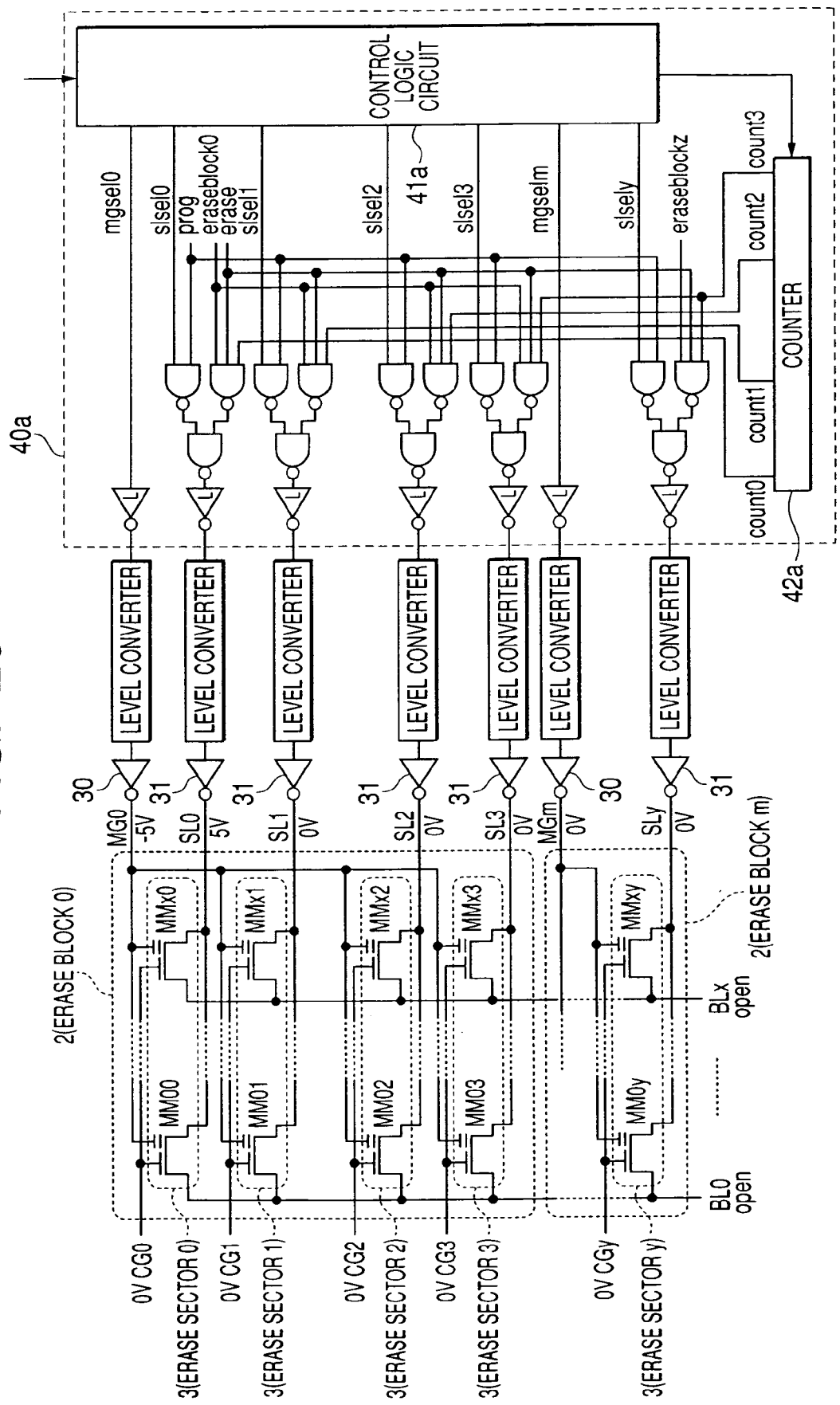
FIG. 20 is a logic circuit diagram showing a circuit structure in which an erase region is specified by the erase block in the memory array of FIG. 12 to time division control erase for each of the erase sectors.

FIG. 20 shows a circuit structure in which an erase region is specified by the erase block in the memory array of FIG. 12 to time division control erase for each of the erase sectors. The memory cells MM are arrayed in lattice form. The control gates, the memory gates and the sources of the memory cells are shareably connected in the row direction. The control gate lines are CG0, CG1, CG2, CG3 and CGy, the memory gate lines are MG0 and MGm, and the source lines are SL0, SL1, SL2, SL3 and SLy. The drains of the memory cells are connected to the bit lines BL0 and BLx and are shareably connected in the column direction. A control circuit 40a controls time division erase for each erase sector in the erase block. mgsel (mgsel0 and mgseln) is a memory gate line select signal, slsel (slsel0 to slsel4 and slsely) is a source line select signal, prog is a write signal, erase is an erase signal, eraseblock (eraseblock0 and eraseblockz) is an erase block select signal, and count (count0 to count3) is a signal time division controlling erase for each erase sector. The slsel and prog of the signals are signals used at write.

The erase block to be erased is instructed by an erase command to the control circuit 40a. A control logic circuit 41a decodes it to bring the erase block select signal eraseblock0 or the eraseblock1 to H level. In the H level period, the memory gate line select signal mgsel0 is at H level. The count operation of a counter 42a is performed in one cycle in the H level period to sequentially change the time division control signals count0 to count3.

The memory cells MM00, MMx0, MM01, MMx1, MM02, MMx2, MM03 and MMx3 constitute erase block 0. The memory cells MM0y and MMxy constitute erase block m. The memory cells MM00 and MMx0 constitute erase sector 0. The select gates of the memory cells are shareably connected to the select gate line CG0. The memory gates thereof are shareably connected to the memory gate line MG0. The sources thereof are shareably connected to the source line SL0. Likewise, the memory cells MM01 and MMx1 constitute erase sector 1. The control gates are shareably connected to the control gate line CG1. The memory gates are shareably connected to the memory gate line MG0. The sources are shareably connected to the source line SL1. The memory cells MM02 to MMx2 constitute erase sector 2. The control gates are shareably connected to the control gate line CG2. The memory gates are shareably connected to the memory gate line MG0. The sources are shareably connected to the source line SL2. The memory cells MM03 and MMx3 constitute erase sector 3. The control gates are shareably connected to the control gate line CG3. The memory gates are shareably connected to the memory gate line MG0. The sources are shareably connected to the source line SL3. The memory cells MM0y and MMxy constitute erase sector y. The control gates are shareably connected to the control gate line CGy. The memory gates are shareably connected to the memory gate line MGm. The sources are shareably connected to the source line SLy.

When erasing the memory cells MM00, MMx0, MM01, MMx1, MM02, MMx2, MM03 and MMx3 in the erase block 0, the signals erase and eraseblock0 are at H level, and the signals slsel and prog are at L level. 0V is applied to the control gate line CG0, and the bit lines BL0 and BLx are open. The signal mgsel0 is at H level, and −5V is applied to the memory gate line MG0. When the signal count0 is at H level, 5V is applied to the source line SL0. In the state that −5V is applied to the memory gate line MG0, −5V is also applied to the memory gates of the memory cells MM01 and MMx1 in the erase sector 1, the memory cells MM02 and MMx2 in the erase sector 2, and the memory cells MM03 and MMx3 in the erase sector 3, which are shareably connected to the memory gate. The memory cells are not erased since 0V is applied to the sources of the memory cells via the source lines SL1, SL2 and SL3. In the erase sector y not to be erased, the memory cells are not erased since the control gate line CGy, the memory gate line MGm and the source line SLy are all 0V. The output of the signal count0 is at L level when a fixed time elapses, and the voltage of the source line SL0 is 0V. The signal count1 is at H level, 5V is applied to the source line SL1, and the erase sector 1 is erased. Likewise, the signals count2 and count3 are sequentially operated to erase the erase sectors 2 and 3. The structure of FIG. 20 can be a hierarchical structure by connecting the bit lines to the hierarchical MOS transistors.

Figure 21:
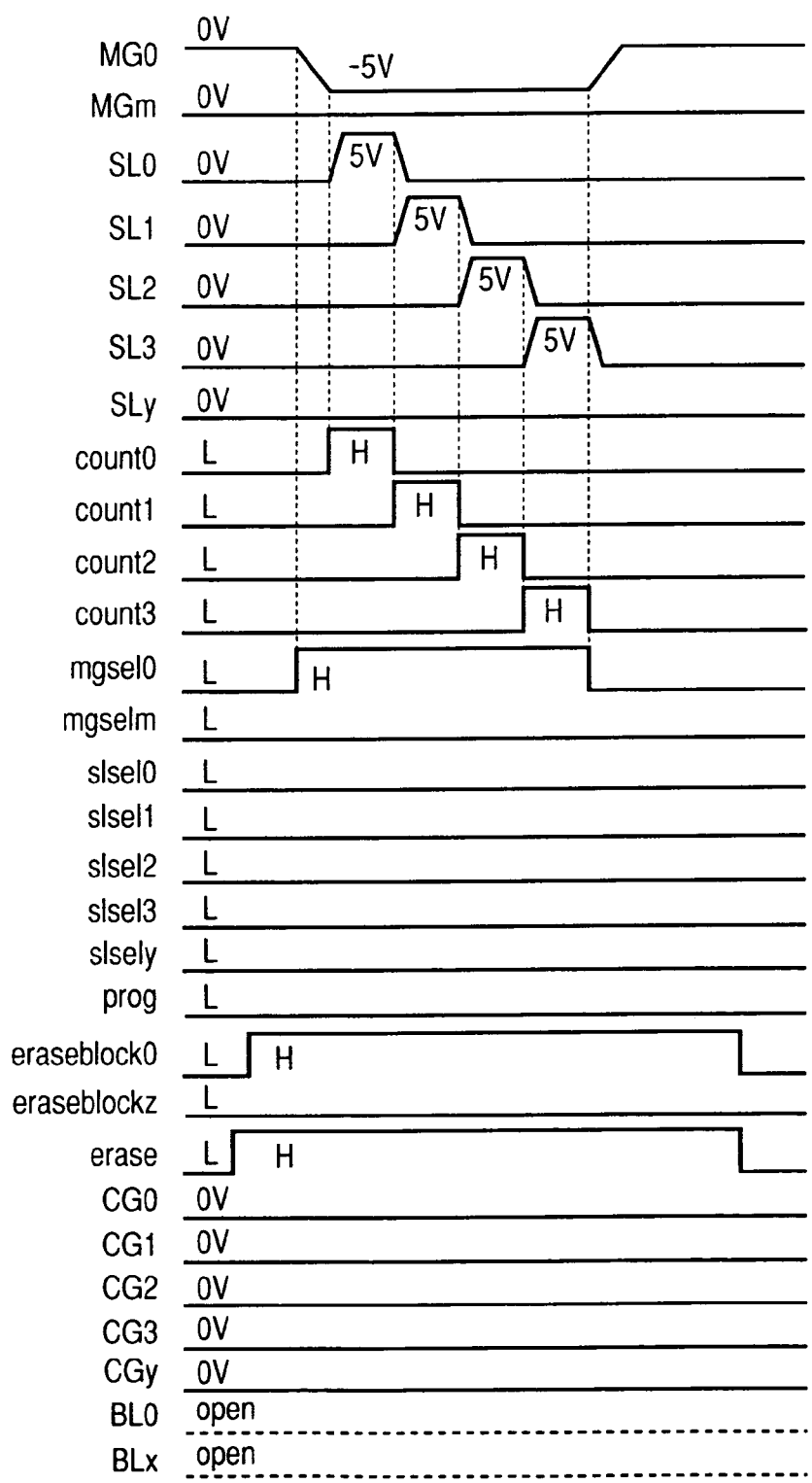
FIG. 21 is a timing chart of erase operation to the erase block of the circuit structure of FIG. 20.

FIG. 21 shows erase timings in the erase block 0 of the circuit structure of FIG. 20. To erase the memory cells MM00, MMx0, MM01, MMx1, MM02, MMx2, MM03 and MMx3 in the erase block 0, 0V is applied to the control gate lines CG0, CG1, CG2 and CG3, and the bit lines BL0 and BLx are open. The signal erase is at H level. The signal eraseblock0 is at H level to select the erase block 0. The signal mgsel0 is at H level, and −5V is applied to the memory gate line MG0. When the signal count0 is at H level, 5V is applied to the source line SL0, and the memory cells are erased. The output of the signal count0 is at L level when a fixed time elapses, and the signal count1 is operated to apply 5V to the source line SL1 for erasing the memory cells in the erase sector 1. When the signal count1 is at L level, the signals count2 and count3 are operated to erase the memory cells in the erase sectors 2 and 3. During erase of the erase block 0, the signals mgselm, slsely, prog and eraseblockz are at L level, and since the memory gate line MGm, the source line SLy and the control gate line CGy are 0V, the memory cells are not erased. The erase time for each sector can be changed by adjusting the H level period of the respective output signals of the counter 42a.

Figure 22:
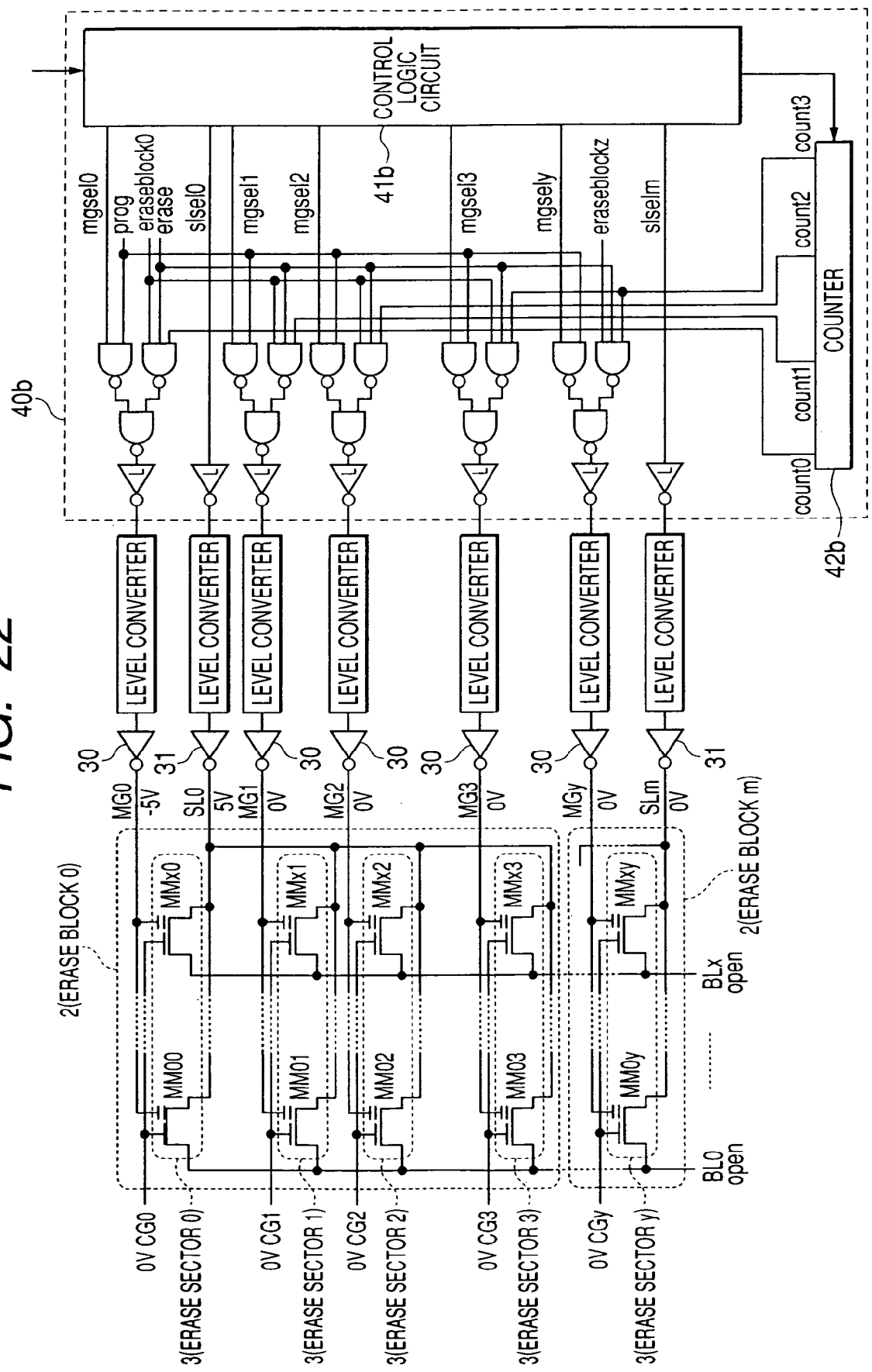
FIG. 22 is a logic circuit diagram showing a circuit structure in which an erase region is specified by the erase block in the memory array of FIG. 14 to time division control erase for each of the erase sectors.

FIG. 22 shows a circuit structure in which an erase region is specified by the erase block in the memory array of FIG. 14 to time division control erase for each of the erase sectors. The memory cells MM are arrayed in lattice form. The control gates, the memory gates and the sources of the memory cells are shareably connected in the row direction. The control gate lines are CG0, CG1, CG2, CG3 and CGy, the memory gate lines are MG0, MG1, MG2, MG3 and MGy, and the source lines are SL0 and SLn. The drains of the memory cells are connected to the bit lines BL0 and BLx and are shareably connected in the column direction. A control circuit 40b controls time division erase for each erase sector in the erase block. mgsel (mgsel0 to mgsel3 and mgsely) is a memory gate line select signal, slsel (slsel0 and slselm) is a source line select signal, prog is a write signal, erase is an erase signal, eraseblock (eraseblock0 and eraseblockz) is an erase block select signal, and count (count0 to count3) is a signal time division controlling erase for each erase sector. The mgsel and prog of the signals are signals used at write.

The erase block to be erased is instructed by an erase command to the control circuit 40b. A control logic circuit 41b decodes it to bring the erase block select signal eraseblock0 or the eraseblock1 to H level. In the H level period, one source line select signal slsel is at H level. The count operation of a counter 42b is performed in one cycle in the H level period to sequentially change the time division control signals count0 to count3.

The memory cells MM00, MMx0, MM01, MMx1, MM02, MMx2, MM03 and MMx3 constitute erase block 0. The memory cells MM0y and MMxy constitute erase block y. The memory cells MM00 and MMx0 constitute erase sector 0. The control gates of the memory cells are shareably connected to the control gate line CG0. The memory gates thereof are shareably connected to the memory gate line MG0. The sources thereof are shareably connected to the source line SL0. Likewise, the memory cells MM01 and MMx1 constitute erase sector 1. The control gates are shareably connected to the control gate line CG1. The memory gates are shareably connected to the memory gate line MG1. The sources are shareably connected to the source line SL0. The memory cells MM02 and MMx2 constitute erase sector 2. The control gates are shareably connected to the control gate line CG2. The memory gates are shareably connected to the memory gate line MG2. The sources are shareably connected to the source line SL0. The memory cells MM03 and MMx3 constitute erase sector 3. The control gates are shareably connected to the control gate line CG3. The memory gates are shareably connected to the memory gate line MG3. The sources are shareably connected to the source line SL0. The memory cells MM0y and MMxy constitute erase sector m. The control gates are shareably connected to the control gate line CGy. The memory gates are shareably connected to the memory gate line MGy. The sources are shareably connected to the source line SLm.

When erasing the memory cells MM00, MMx0, MM01, MMx1, MM02, MMx2, MM03 and MMx3 in the erase block 0, the erase and eraseblock0 are at H level, and the mgsel and prog are at L level. 0V is applied to the select gate line CG0, and the bit lines BL0 and BLx are open. The slsel0 is at H level, and 5V is applied to the source line SL0. The count0 is at H level, and −5V is applied to the memory gate line MG0. In the state that 5V is applied to the source line SL0, 5V is also applied to the sources of the memory cells MM01 and MMx1 in the erase sector 1, the memory cells MM02 and MMx2 in the erase sector 2, and the memory cells MM03 and MMx3 in the erase sector 3, which are shareably connected to the source. The memory cells are not erased since 0V is applied to the memory gates of the memory cells via the memory gate lines MG1, MG2 and MG3. In the erase sector y not to be erased, the memory cells are not erased since the select gate line CGy, the memory gate line MGy and the source line SLm are all 0V. The output of the count0 is at L level when a fixed time elapses, and the voltage of the source line SL0 is 0V. The count1 is at H level, −5V is applied to the memory gate line MG1, and the erase sector 1 is erased. Likewise, the count2 and count3 are sequentially operated to erase the erase sectors 2 and 3. As described above, all the memory cells in the erase block 0 are erased. The structure of FIG. 21 can be a hierarchical structure by connecting the bit lines to the hierarchical MOS transistors.

Figure 23A:
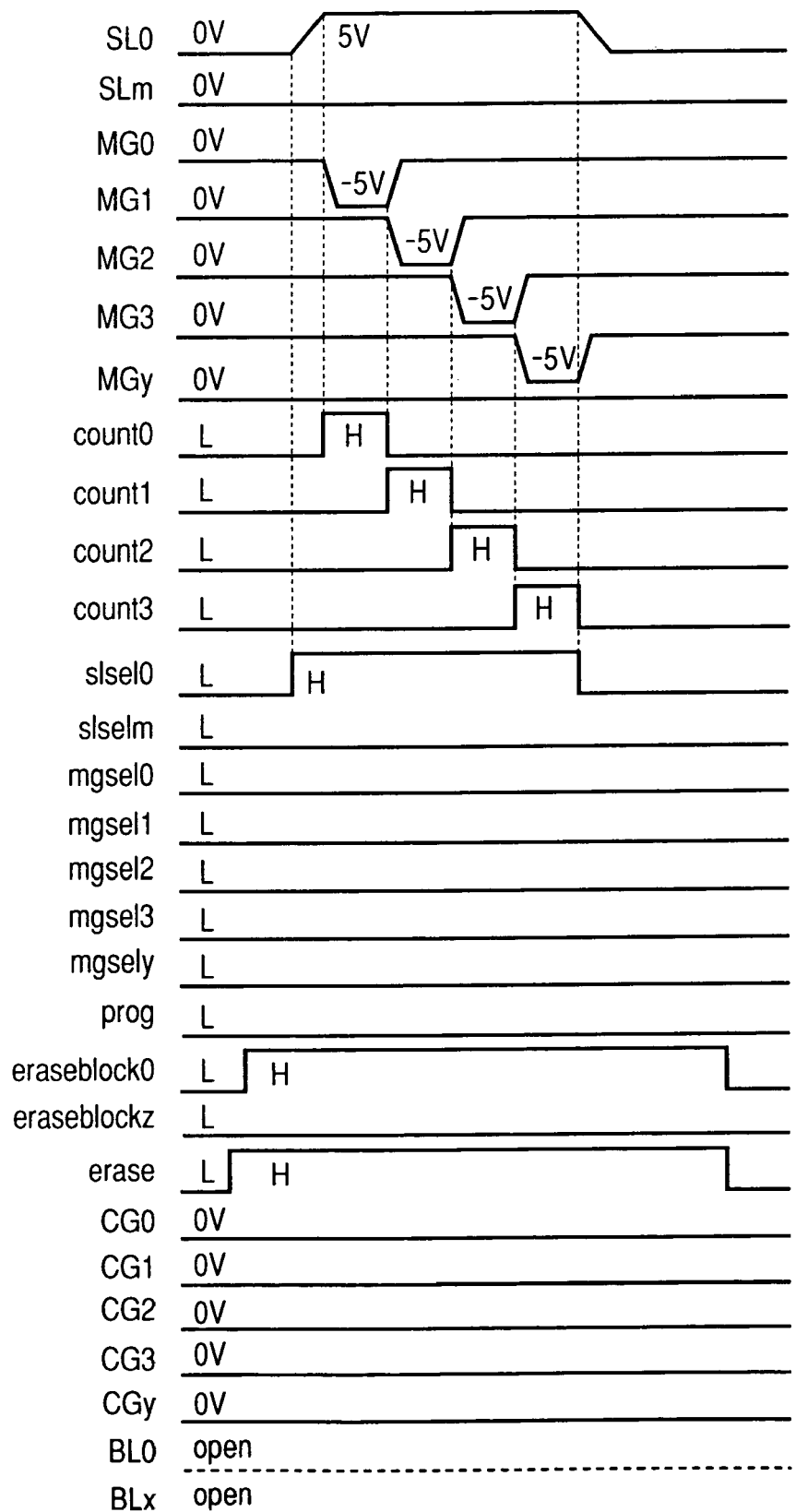
FIG. 23A is a timing chart of erase operation to the erase block of the circuit structure of FIG. 22.
Figure 23B:
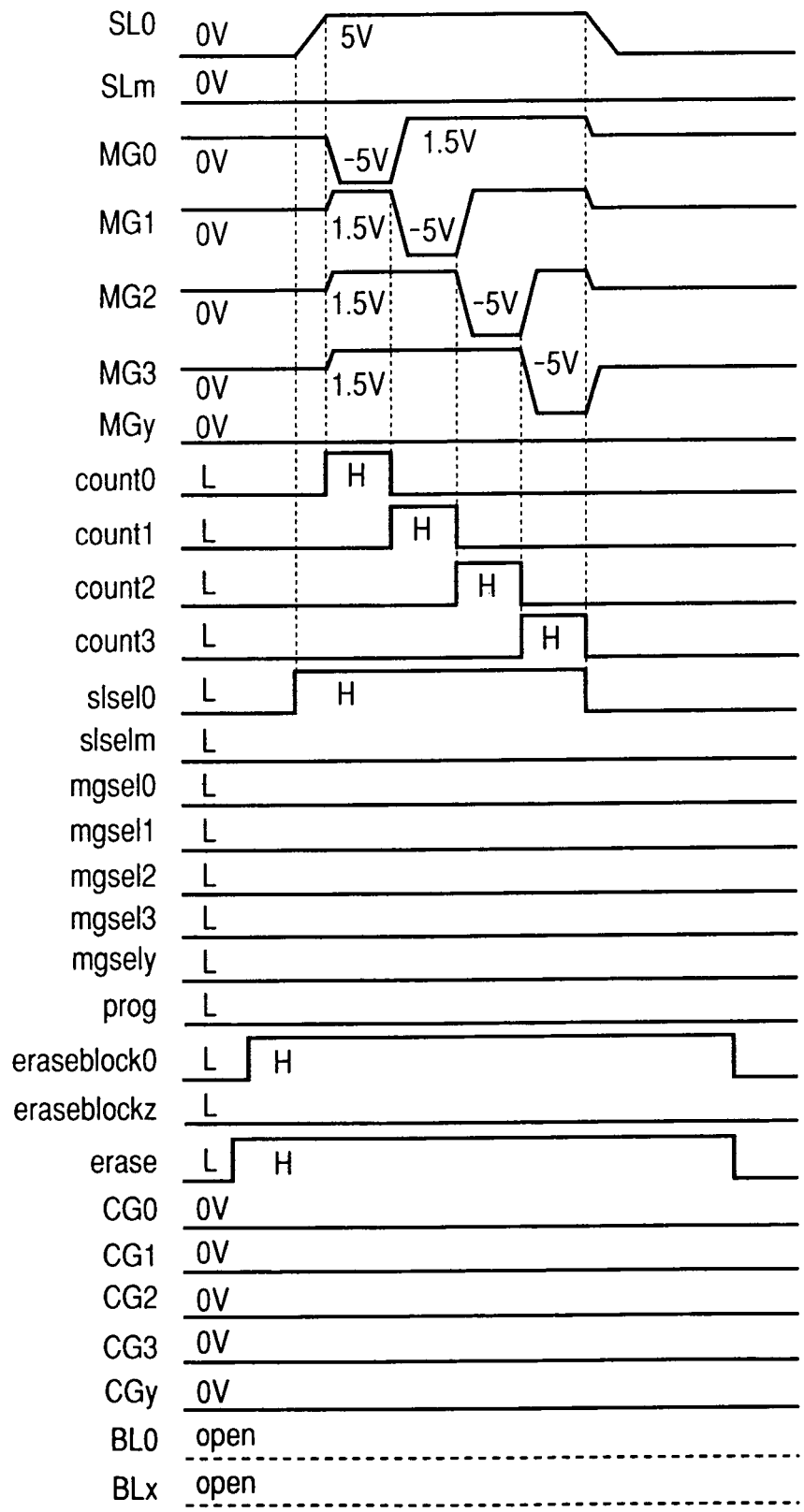
FIG. 23B is a timing chart of another erase operation to the erase block of the circuit structure of FIG. 22.

FIGS. 23A and 23B show erase timings in the erase block 0 of the circuit structure of FIG. 22. To erase the memory cells MM00, MMx0, MM01, MMx1, MM02, MMx2, MM03 and MMx3 in the erase block 0, 0V is applied to the control gate lines CG0, CG1, CG2 and CG3, and the bit lines BL0 and BLx are open. The signal erase is at H level. The signal eraseblock0 is at H level to select the erase block 0. The signal slsel0 is at H level, and 5V is applied to the source line SL0. When the signal count0 is at H level, −5V is applied to the memory gate line MG0, and the memory cells are erased. The output of the signal count0 is at L level when a fixed time elapses, and the signal count1 is operated to apply −5V to the memory gate line MG1 to erase the memory cells in the erase sector 1. When the signal count1 is at L level, the signals count2 and count3 are sequentially operated to erase the memory cells in the erase sectors 2 and 3. During erase of the erase block 0, the signals slselm, prog and eraseblockz are at L level, and since the memory gate line MGy, the source line SLm and the control gate line Gy are 0V, the memory cells are not erased. The erase time for each sector can be changed by adjusting the H level period of the respective output signals count of the counter 42b. FIG. 23B is different from FIG. 23A in that a voltage of 1.5V is applied to the memory gate line of the unselected sector in the block to be erased and can reduce the magnitude of an undesired electric field applied to the sector not to be erased.

Figure 24:
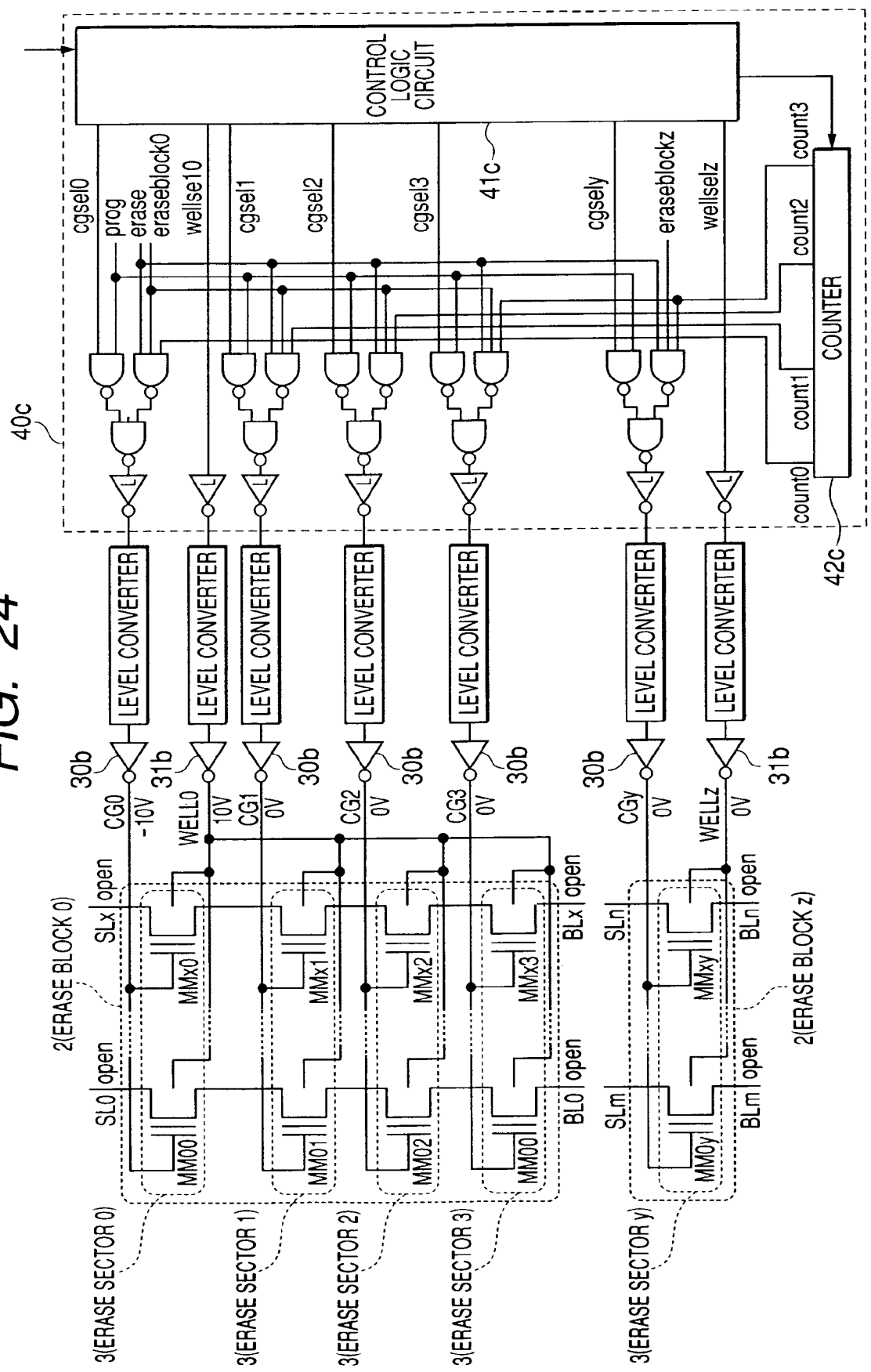
FIG. 24 is a logic circuit diagram showing a circuit structure in which an erase region is specified by the erase block in the memory array of FIG. 16 to time division control erase for each of the erase sectors.

FIG. 24 shows a circuit structure in which an erase region is specified by the erase block in the memory array of FIG. 16 to time division control erase for each of the erase sectors. The memory cells MM are arrayed in lattice form. The control gates of the memory cells are shareably connected in the row direction, and the drains and the sources are shareably connected in the column direction. The wells are connected for each erase block. The control gate lines are indicated as CG0, CG1, CG2, CG3 and CGy, the source lines are indicated as SL0, SLx, SLm and SLn, the bit lines are indicated as BL0, BLx, BLm and BLn, and the well lines are indicated as WELL0 and WELLz. A control circuit 40c controls time division erase for each erase sector in the erase block. cgsel (cgsel0 to cgsel3 and vgsely) is a control gate line select signal, prog is a write signal, erase is an erase signal, eraseblock (eraseblock0 and eraseblockz) is an erase block select signal, wellsel (wellsel0 and wellselz) is a well line select signal, and count (count0 to count3) is a signal time division controlling erase for each erase sector. The cgsel and prog of them are signals used at write.

The erase block to be erased is instructed by an erase command to the control circuit 40c. A control logic circuit 41c decodes it to bring one erase block select signal eraseblock to H level. In the H level period, one well select signal (wellsel) is at H level. The count operation of a counter 42c is performed in one cycle in the H level period to sequentially change the time division control signals count1 to count3.

The memory cells MM00, MMx0, MM01, MMx1, MM02, MMx2, MM03 and MMx3 constitute erase block 0. The memory cells MM0y and MMxy constitute erase block z. The memory cells MM00 and MMxy constitute erase sector 0. The control gates of the memory cells are connected to the control gate line CG0. The wells thereof are connected to the well line WELL0. Likewise, the memory cells MM01 and MMx1 constitute erase sector 1. The control gate line CG1 is shareably connected to the well line WELL0. The memory cells MM02 and MMx2 constitute erase sector 2. The control gate line CG2 is shareably connected to the well line WELL0. The memory cells MM03 and MMx3 constitute erase sector 3. The control gate line CG3 is shareably connected to the well line WELL0. The memory cells MM0y and MMxy constitute erase sector y. The control gates are shareably connected to the control gate line CGy. The wells are shareably connected to the well line WELLz.

When erasing the memory cells MM00, MMx0, MM01, MMx1, MM02, MMx2, MM03 and MMx3 in the erase block 0, the signals erase and eraseblock0 are at H level, and the signals cgsel and prog are at L level. The signal wellsel0 is at H level and 10V is applied to the well line WELL0. When the signal count0 is at H level, −10V is applied to the control gate line CG0. In the state that 10V is applied to the well line WELL0, 10V is also applied to the wells of the memory cells MM01, MMx1, MM02, MMx2, MM03 and MMx3 in the erase block 0 shareably connected to the well. They are not erased since 0V is applied to the control gates of the memory cells via the control gate lines CG1, CG2 and CG3. In the erase sector y not to be erased, the memory cells are not erased since the control gate line CGy and the well line WELLz are all 0V. The output of the signal count0 is at L level when a fixed time elapses, and the voltage of the control gate line CG0 is 0V. The signal count1 is at H level, −10V is applied to the control gate line CG1, and the erase sector 1 is erased. Likewise, the signals count2 and count3 are sequentially operated to erase the erase sectors 2 and 3. As described above, all the memory cells in the erase block 0 are erased.

Figure 25:
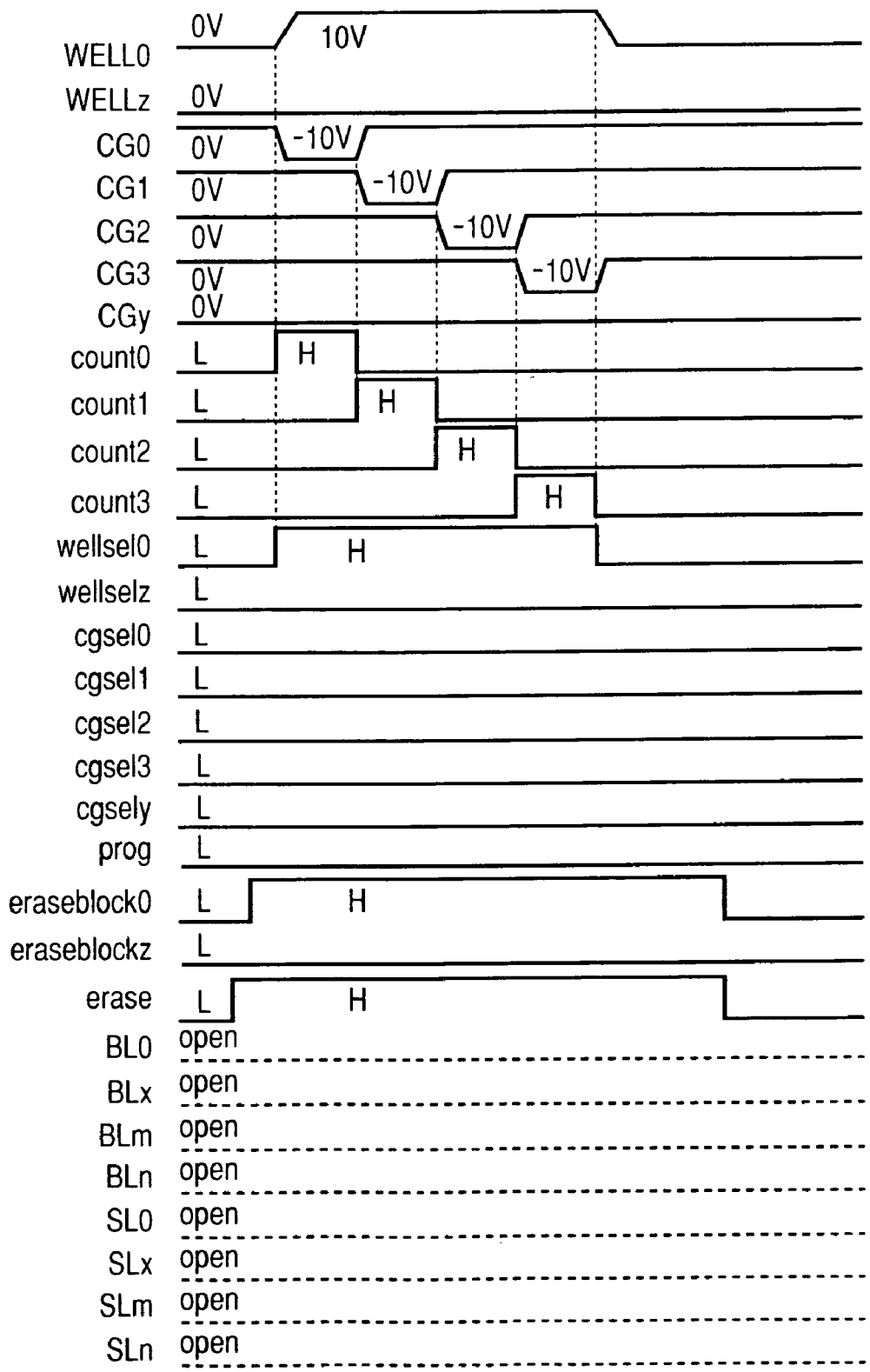
FIG. 25 is a timing chart of erase operation to the erase block of FIG. 24.

FIG. 25 shows erase timings in the erase block 0 of FIG. 24. To erase the memory cells MM00, MMx0, MM01, MMx1, MM02, MMx2, MM03 and MMx3 in the erase block 0, the source lines SL0, SLx, SLm and SLn and the bit lines BL0, BLx, BLm and BLn are open. The signals erase and eraseblock0 are at H level to select the erase block 0. The signal wellsel0 is at H level, and 10V is applied to the well line WELL0. When the signal count0 is at H level, −10V is applied to the control gate line CG0, and the memory cells MM00, MM01, MM02 and MM03 are erased. When completing erase of the memory cells in the erase sector 0, the signal count0 is at L level, the signal count1 is at H level, and −10V is applied to the control gate line CG1. When the signal count1 is at L level, the signals count2 and count3 are sequentially changed to H level to erase the memory cells in the erase sectors 2 and 3. During erase of the erase block 0, the signals cgsely, prog and eraseblockz are at L level, and since the control gate line CGy and the well line WELLz are 0V, the memory cells are not erased. The erase time for each sector can be changed by adjusting the H level period of the output of the counter 42c.

Figure 26:
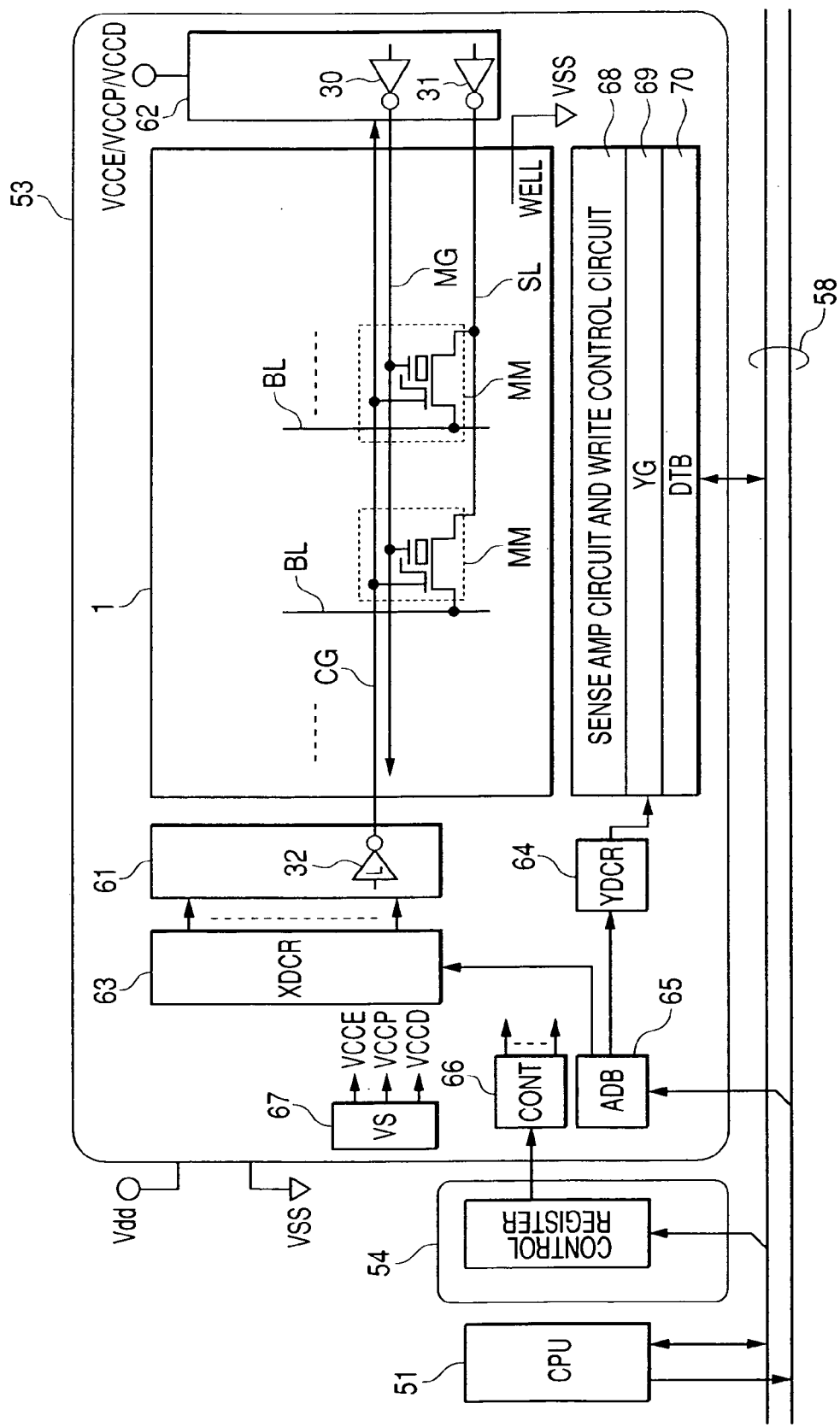
FIG. 26 is a block diagram showing the overall structure of an on-chip flash memory over a microcomputer.

FIG. 26 shows an overall block diagram of an on-chip flash memory over a microcomputer. A flash memory module 53 and a flash memory controller 54 share a CPU (central processing unit) 51 and a bus 58. The bus 58 includes an address bus 58A and a data bus 58D. The flash memory 53 has the memory array 1 in which memory cells MM of the split gate structure are arrayed in a matrix. A driver circuit 61 has a control gate driver 32. A driver circuit 62 has a memory gate driver 30 and a source driver 31. Drive select signals to the drivers 30, 31 and 32 are generated by an X address decoder (XDCR) 63 and a timing control circuit (CONT) 66. The control circuit for time division erase indicated by the numeral 40 is realized by the X address decoder (XDCR) 63 and the timing control circuit (CONT) 66. High-voltages VCCE/VCCP/VCCD used for erase and write are generated by a voltage generator circuit 67. A necessary power source is supplied to the driver circuit 62 according to the operation mode. The high voltage need not be supplied to the driver circuit 61. In FIG. 26, the numeral 64 denotes a Y address decoder; the numeral 65 denotes an address buffer; the numeral 68 denotes a sense amp circuit and a write circuit; the numeral 69 denotes a Y select circuit; and the numeral 70 denotes a data input/output buffer (DTB). Vdd is an external power source, and VSS is a ground potential of the circuit.

The write operation will be described. When an address signal is inputted to the address buffer 65, the X address decoder 63 and the Y address decoder 64 select one or more memory cells 1 in the memory array 1. A voltage is applied to the control gate of the selected memory cell 1. When write data is inputted from the data bus 58D to the data input/output buffer 70, the data is stored in the write circuit 68. The write circuit 68 controls write select or write nonselect to the selected memory cell according to a logic value of the write data and applies a writing voltage to the memory cell as write select. The writing high voltage is applied to the memory gate and the source of the memory cell 1 as write select to be performed by source side injection.

The erase operation will be described. When an address is inputted from an address bus 68A to the address buffer 65, the X address decoder 63, the Y address decoder 64 and the control circuit 66 select the memory block erased together and are operated so as to provide erasing voltages to the erase sectors constructing the erase block in time division.

The read operation will be described. When an address is inputted from the address bus 58A to the address buffer 65, the X address decoder 63 and the Y address decoder 64 select one or more memory cells MM in the memory array 1. A current value outputted to the bit line is detected by the sense amp circuit 68 corresponding to the threshold voltage state of the selected memory cell MM. The result is outputted via the data input/output buffer 70 to the data bus 58D.

Figure 27:
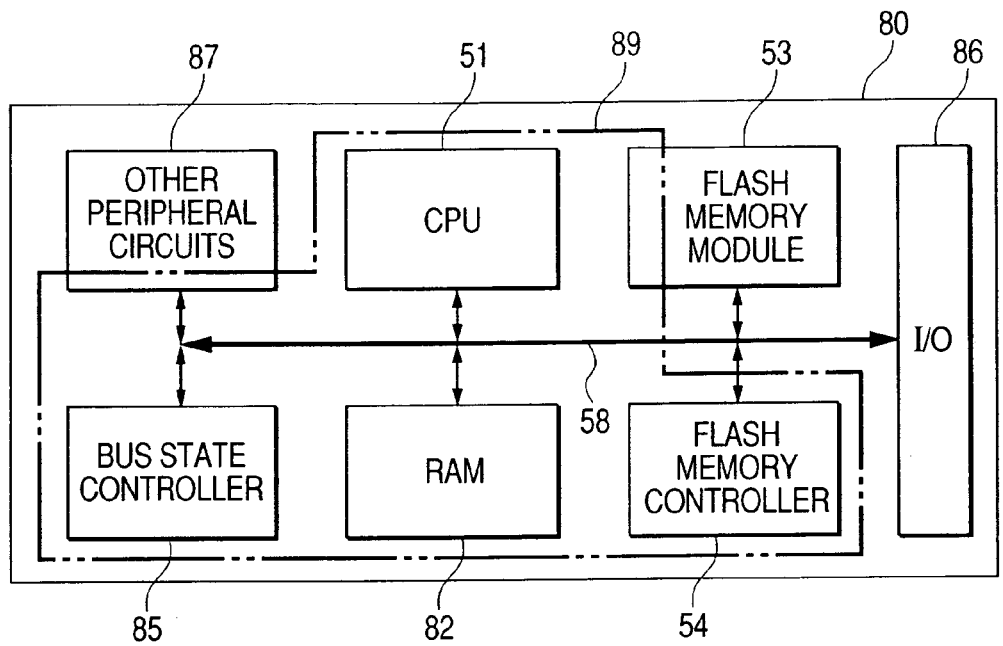
FIG. 27 is a block diagram showing the configuration of a microcomputer having the on-chip flash memory.

FIG. 27 shows the overall configuration of a semiconductor data processing device having on-chip nonvolatile memory employing the above-described nonvolatile memory cells, e.g., a microcomputer. Not being particularly limited, a microcomputer 80 is formed over one semiconductor substrate (semiconductor chip) such as a single crystal silicon by the CMOS integrated circuit fabrication technique. The microcomputer 80 has the CPU (central processing unit) 51, a RAM 82 as volatile memory, the flash memory module 53 as nonvolatile memory, the flash memory controller 54, a bus state controller 85, an input/output circuit (I/O) 86 such as an input/output port circuit, and other peripheral circuits 87. The circuit modules are connected to the internal bus 58. The internal bus 58 has signal lines of an address, data and control signals. The CPU 51 has a command control part and an execution part, decodes a fetched command, and performs operation processing according to the decoded result. The flash memory module 53 stores an operation program and data of the CPU 51. The RAM 82 is a work area or a temporary data storage area of the CPU 51. The operation of the flash memory module 53 is controlled based on control data the CPU 51 sets to the control register of the flash controller 54. The bus state controller 85 controls access via the internal bus 58, the number of access cycles to external bus access, wait state insertion and a bus width.

In FIG. 27, the circuit of an area 89 enclosed by the chain double-dashed line means a circuit portion constructed by a MOS transistor in which the gate oxide film is relatively thin. The CPU 51 is an example of a logic circuit constructed by a low voltage MOS transistor in which the gate oxide film is thin. The circuit other than the area 89 is a circuit portion constructed by a high voltage MOS transistor in which the gate oxide film is relatively thick. For instance, it is an area in which the high voltage drivers 30 and 31 are formed in the flash memory module 53.

The above-described flash memory module and microcomputer decrease the number of memories erased at the same time to distribute an erasing current, thereby reducing the load of the internal power circuit. The drivers applying two kinds of erasing voltages to the flash memory cell are shared between the erase sectors. The logic size of the control logic circuit for erase and the number of drivers can be decreased, thereby making the chip area smaller. The invention which has been made by the present inventors is specifically described above based on the embodiments. The present invention is not limited to it and various modifications can be made in the scope without departing from its purpose. The present invention can be widely applied to other semiconductor integrated circuits as well as a flash memory and a microcomputer incorporating the same.

What is claimed is:

1. A semiconductor data processing device comprising:
   a memory array having nonvolatile memory cells arrayed in a matrix and divided into a plurality of erase blocks, wherein each said erase block is further divided into a plurality of erase sectors, the said nonvolatile memory cells in the erase block instructed to be erased together; and
   a control circuit,
   wherein said control circuit controls both of two erasing voltages applied to the nonvolatile memory cells in the erase block instructed to be erased together to select one of the erase sectors from the erase block for performing erase for each erase sector one erase sector at a time, thereby performing said erase for each erase sector in the erase block instructed to be erased in time division, and
   wherein each said nonvolatile memory cell has a source, a drain, a channel, a control gate arranged over the channel on said drain side, and a charge storage region and a memory gate stacked over the channel on said source side such that the memory gate and the charge storage region are electrically insulated from each other, and wherein a dielectric breakdown seen from said control gate is lower than that seen from said memory gate.

2. The semiconductor data processing device according to claim 1, wherein two erasing voltage driving drivers applying the two erasing voltages shareably drive a plurality of sectors.

3. The semiconductor data processing device according to claim 2, further comprising a switch MOS transistor which can selectively connect a bit line connected to said drain to a global bit line,
   wherein a gate breakdown voltage of said switch MOS transistor is lower than that seen from said memory gate of said nonvolatile memory cell.

4. The semiconductor data processing device according to claim 3, further comprising a first driver driving a control gate control line connected to said control gate, a second driver driving a memory gate control line connected to said memory gate, a third driver driving said switch MOS transistor to an ON state, and a fourth driver driving a source line connected to said source,
   wherein said second and fourth drivers are said two erasing voltage driving drivers, and
   wherein said first and third drivers use a first voltage as an operating power source and said second and fourth drivers use a voltage higher than said first voltage as an operating power source.

5. The semiconductor data processing device according to claim 4, wherein said control circuit, when increasing a memory cell threshold voltage seen from said memory gate by write, uses the operating power source of the first driver as the first voltage, the operating power source of the fourth driver as a second voltage higher than the first voltage, and the operating power source of the second driver as a third voltage higher than the second voltage, to inject hot electrons from a bit line electrode side into the charge storage region.

6. The semiconductor data processing device according to claim 5, wherein said control circuit, when decreasing the memory cell threshold voltage seen from said memory gate by erase, uses the operating power source of said second driver as a fourth voltage lower than the third voltage, and the operating power source of said fourth driver as a fifth voltage higher than the second voltage, to inject holes into the charge storage region to make electrons disappear.

7. The semiconductor data processing device according to claim 5, wherein said control circuit, when reading stored information from a said nonvolatile memory cell, uses the operating power source of the first driver as the first voltage.

8. The semiconductor data processing device according to claim 6, wherein said first and third drivers input an address decode signal to select operation, and said second and fourth drivers input an output of the first driver to select operation.

9. The semiconductor data processing device according to claim 8, wherein said first and third drivers are arranged on one side across the array of said nonvolatile memory cells, and said second and fourth drivers are arranged on another side.

10. The semiconductor data processing device according to claim 4, further comprising a logic operating unit performing logic operation using said first voltage as an operating power source.

11. A semiconductor data processing device comprising:
    a memory array having nonvolatile memory cells arrayed in a matrix and divided into a plurality of erase blocks, wherein each said erase block is further divided into a plurality of erase sectors, the said nonvolatile memory cells in the erase block instructed to be erased together;
    a control circuit;
    wherein said control circuit controls both of two erasing voltages applied to the nonvolatile memory cells in the erase block instructed to be erased together to select one of the erase sectors from the erase block for performing erase for each erase sector one erase sector at a time, thereby performing said erase for each erase sector in the erase block instructed to be erased in time division;
    wherein two erasing voltage driving drivers applying the two erasing voltages shareably drive a plurality of sectors; and
    a switch MOS transistor which can selectively connect a bit line connected to said drain to a global bit line,
    wherein a gate breakdown voltage of said switch MOS transistor is lower than that seen from said memory gate of said nonvolatile memory cell.

12. The semiconductor data processing device according to claim 11, further comprising a first driver driving a control gate control line connected to said control gate, a second driver driving a memory gate control line connected to said memory gate, a third driver driving said switch MOS transistor to an ON state, and a fourth driver driving a source line connected to said source, wherein said second and fourth drivers are said two erasing voltage driving drivers, and wherein said first and third drivers use a first voltage as an operating power source and said second and fourth drivers use a voltage higher than said first voltage as an operating power source.

13. The semiconductor data processing device according to claim 12, wherein said control circuit, when increasing a memory cell threshold voltage seen from said memory gate by write, uses the operating power source of the first driver as the first voltage, the operating power source of the fourth driver as a second voltage higher than the first voltage, and the operating power source of the second driver as a third voltage higher than the second voltage, to inject hot electrons from a bit line electrode side into the charge storage region.

14. The semiconductor data processing device according to claim 13, wherein said control circuit, when decreasing the memory cell threshold voltage seen from said memory gate by erase, uses the operating power source of said second driver as a fourth voltage lower than the third voltage, and the operating power source of said fourth driver as a fifth voltage higher than the second voltage, to inject holes into the charge storage region to make electrons disappear.

15. The semiconductor data processing device according to claim 13, wherein said control circuit, when reading stored information from a said nonvolatile memory cell, uses the operating power source of the first driver as the first voltage.

16. The semiconductor data processing device according to claim 14, wherein said first and third drivers input an address decode signal to select operation, and said second and fourth drivers input an output of the firs driver to select operation.

17. The semiconductor data processing device according to claim 16, wherein said first and third drivers are arranged on one side across the array of said nonvolatile memory cells, and said second and fourth drivers are arranged on another side.

18. The semiconductor data processing device according to claim 12, further comprising a logic operating unit performing logic operation using said first voltage as an operating power source.

* * * * *